US012531212B2

(12) United States Patent
Lee et al.

(10) Patent No.: US 12,531,212 B2
(45) Date of Patent: Jan. 20, 2026

(54) DIMPLE PLATE ADJUSTMENT DEVICE

(71) Applicant: SAMSUNG ELECTRONICS CO., LTD., Suwon-si (KR)

(72) Inventors: Hyunjung Lee, Suwon-si (KR); Yongjoo Cho, Suwon-si (KR); Sunho Kim, Suwon-si (KR); Woojae Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 69 days.

(21) Appl. No.: 18/768,778

(22) Filed: Jul. 10, 2024

(65) Prior Publication Data

US 2025/0118540 A1 Apr. 10, 2025

(30) Foreign Application Priority Data

Oct. 4, 2023 (KR) ........................ 10-2023-0131940

(51) Int. Cl.
*H01J 37/32* (2006.01)

(52) U.S. Cl.
CPC ..... *H01J 37/32623* (2013.01); *H01J 37/3211* (2013.01); *H01J 37/32183* (2013.01)

(58) Field of Classification Search
None
See application file for complete search history.

(56) References Cited

U.S. PATENT DOCUMENTS 8,402,918 B2 3/2013 Kadkhodayan et al.
8,414,719 B2 4/2013 Patrick et al.
8,415,884 B2 4/2013 Chen et al.
8,573,152 B2 11/2013 de la Llera et al.
8,580,092 B2 11/2013 Hawryl et al.
2005/0098106 A1 5/2005 Fink et al.
2014/0312227 A1* 10/2014 Yoshikawa ........... H01J 37/023 250/310
2015/0225854 A1* 8/2015 Madsen .............. C23C 16/4409 239/548
2020/0142326 A1* 5/2020 Huang ................ G03F 7/70716
2023/0162954 A1* 5/2023 Johanson .......... H01J 37/32697 361/234
2024/0011147 A1* 1/2024 Ceballos ................. C23C 14/50

FOREIGN PATENT DOCUMENTS

KR 10-2464460 11/2022
KR 10-2023-0030214 3/2023

* cited by examiner

*Primary Examiner* — Wilson Lee
(74) *Attorney, Agent, or Firm* — Fish & Richardson P.C.

(57) ABSTRACT

A dimple plate precision adjustment device includes a dimple carrier assembled on a cylindrical dimple plate and capable of transporting the cylindrical dimple plate; a dimple spacer capable of mounting the dimple carrier assembled on the dimple plate; and a plurality of gap measurers installed on the dimple spacer to be spaced apart from each other. The dimple carrier, the dimple spacer, and the gap measurers assembled on the dimple plate are installed in a body of a chamber where an antenna electrode is installed, and the gap measurers measure a gap between the gap measurers and the dimple carrier.

20 Claims, 25 Drawing Sheets

DIMPLE PLATE ADJUSTMENT DEVICE

CROSS-REFERENCE TO RELATED APPLICATION

This application claims priority under 35 U.S.C. § 119 to Korean Patent Application No. 10-2023-0131940, filed on Oct. 4, 2023, in the Korean Intellectual Property Office, the disclosure of which is incorporated by reference herein in its entirety.

BACKGROUND

Aspects of this disclosure relate to dimple plates, for example, for plasma processing apparatuses.

Electronic devices, such as semiconductor devices, liquid crystal display (LCD) devices, light-emitting diode (LED) devices, etc., may be manufactured using a plasma processing apparatus. The plasma processing apparatus may include a plasma film deposition device or a plasma etching device. In a plasma processing apparatus, an antenna electrode for generating plasma is used with a dimple plate for controlling plasma density.

SUMMARY

Some aspects of this disclosure provide dimple plate precision adjustment devices capable of controlling plasma density by precisely adjusting a dimple plate coupled to an antenna electrode included in a plasma processing apparatus.

According to some implementations of the present disclosure, there is provided a dimple plate precision adjustment device including a dimple carrier assembled on a cylindrical dimple plate and capable of transporting the cylindrical dimple plate, a dimple spacer capable of mounting the dimple carrier assembled on the dimple plate, and a plurality of gap measurers installed on the dimple spacer to be spaced apart from each other. The dimple carrier assembled on the dimple plate, the dimple spacer, and the gap measurers are installed in a body of a chamber where an antenna electrode is installed, and the gap measurers measure a gap between the gap measurers and the dimple carrier.

According to some implementations of the present disclosure, there is provided a dimple plate precision adjustment device including a dimple carrier assembled on a cylindrical dimple plate and capable of transporting the cylindrical dimple plate, wherein the dimple carrier includes a cylindrical carrier body, a plurality of traction members installed on the cylindrical carrier body, and a plurality of protruding members protruding outward and downward from the cylindrical carrier body, wherein a front alignment hole and alignment guide holes are installed in the protruding members, In some implementations, the dimple plate precision adjustment device includes a dimple spacer capable of mounting the dimple carrier assembled on the dimple plate, wherein the dimple spacer includes a cylindrical spacer body, and front alignment pins and alignment guide pins installed on the cylindrical spacer body, wherein the front alignment pin and the alignment guide pins are inserted into the front alignment hole and the alignment guide holes, respectively.

In some implementations, the dimple plate precision adjustment device includes a plurality of gap measurers installed on the dimple spacer to be spaced apart from each other, wherein the gap measurers include measuring bodies installed on the dimple spacer, control knobs installed on the measuring bodies, and gap adjustment pushers for adjusting a gap between the measuring body and the dimple carrier on the control knobs, In some implementations, the dimple carrier, the dimple spacer, and the gap measurers assembled on the dimple plate are installed in a body of a chamber where the antenna electrode is installed, and the gap measurers measure a gap between the gap measurers and the dimple carrier and adjust a center of the dimple carrier mounted on the antenna electrode using the gap adjustment pushers.

According to some implementations of the present disclosure, there is provided a dimple plate precision adjustment device including a dimple carrier assembled on a cylindrical dimple plate and capable of transporting the cylindrical dimple plate, wherein the dimple carrier includes a cylindrical carrier body, a plurality of traction members installed on the cylindrical carrier body, and a plurality of protruding members protruding outward and downward from the cylindrical carrier body, wherein the protruding members are arranged to be spaced apart from each other in a circumferential direction of the carrier body, and front alignment hole and alignment guide holes are installed in the protruding members, and the dimple carrier includes height adjustment pushers capable of adjusting a height of the dimple carrier on the protruding members on one side of the front alignment hole and the alignment guide hole.

In some implementations, the dimple plate precision adjustment device includes a dimple spacer capable of mounting the dimple carrier assembled on the dimple plate, wherein the dimple spacer includes a cylindrical spacer body, and front alignment pins and alignment guide pins installed on the cylindrical spacer body to correspond to the protruding members, wherein the front alignment pin and the alignment guide pin are inserted into the front alignment hole and the alignment guide hole, respectively.

In some implementations, the dimple plate precision adjustment device includes a plurality of gap measurers installed on the dimple spacer to be spaced apart from each other, wherein the gap measurers include measuring bodies installed on the dimple spacer in response to the protruding members, control knobs installed on the measuring bodies, and gap adjustment pushers on the control knobs that adjust a gap between the measuring body and the dimple carrier, In some implementations, the dimple carrier, the dimple spacer, and the gap measurers assembled on the dimple plate are installed in a body of a chamber where the antenna electrode is installed, and the gap measurers measure a gap between the gap measurers and the dimple carrier and adjust a center of the dimple carrier mounted on the antenna electrode using the gap adjustment pushers.

BRIEF DESCRIPTION OF THE DRAWINGS

Implementations according to the present disclosure will be more clearly understood from the following detailed description taken in conjunction with the accompanying drawings in which.

DETAILED DESCRIPTION

Hereinafter, examples according to the present disclosure are described in detail with reference to the attached drawings. Implementations can correspond to one of the illustrated examples or combinations of multiple of the examples. Accordingly, the scope of this disclosure should not be construed as being limited to any one example.

In this specification, singular forms of elements may include plural forms, unless the context clearly indicates otherwise. In this specification, the drawings are exaggerated to more clearly explain the illustrated concepts.

Figure 1:
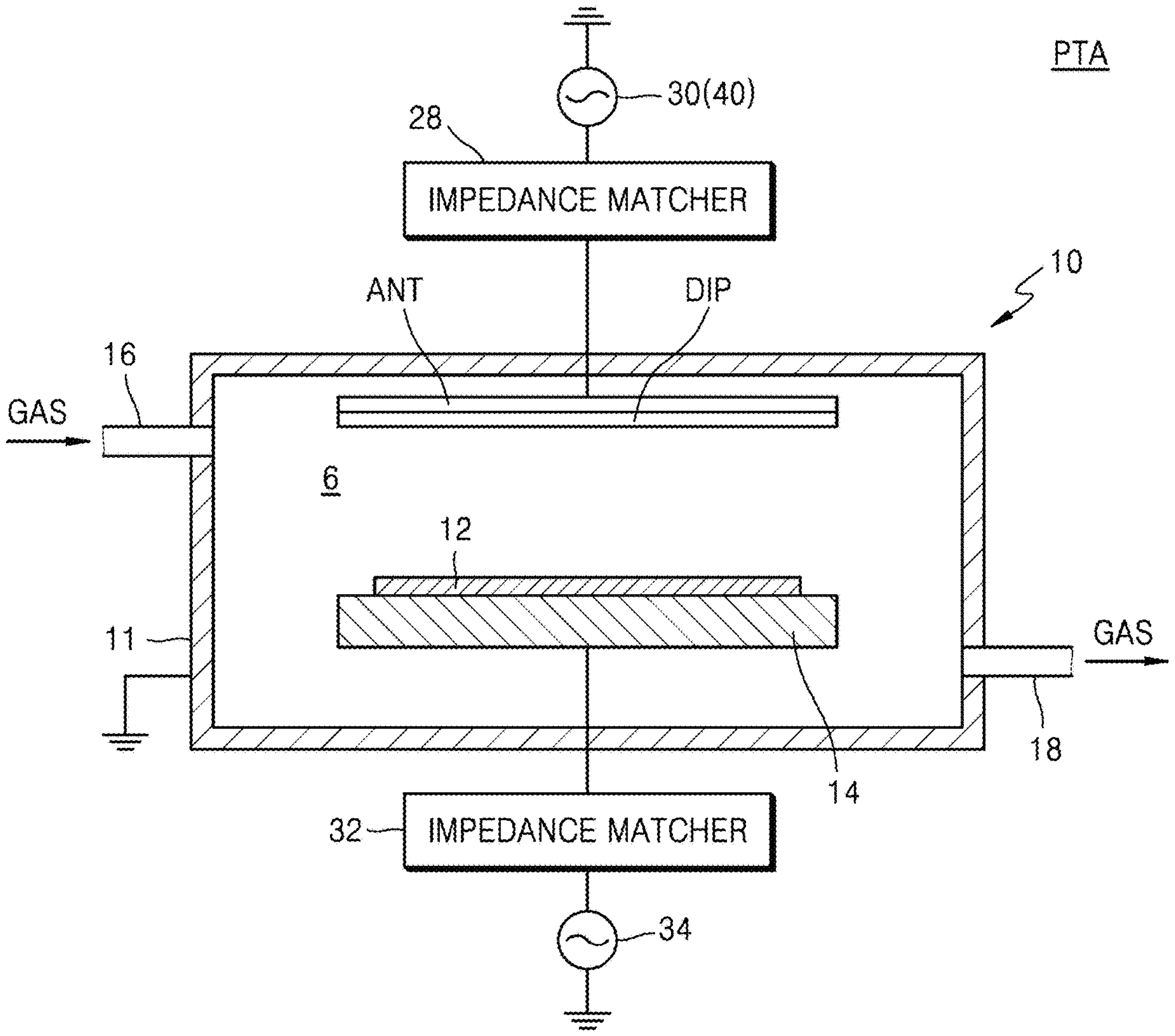
FIG. 1 is a cross-sectional view schematically showing an example of a plasma processing apparatus in which a dimple plate precision adjustment device may be used.

FIG. 1 is a cross-sectional view schematically showing a plasma processing apparatus in which a dimple plate precision adjustment device may be used.

In detail, as an example of a plasma processing apparatus PTA, an inductively coupled plasma (ICP) etching or deposition device is presented. The plasma processing apparatus PTA includes a process chamber 10 in which a gas injector 16 and a gas discharger 18 are installed. The process chamber 10 may have an internal space 6 within a body 11. The internal space 6 may be a processing room for plasma processing.

The process chamber 10 may be grounded. A process gas, such as an etching gas or a deposition gas, may be introduced into the process chamber 10 through the gas inlet 16 and discharged to the outside of the process chamber 10 through the gas outlet 18. The process chamber 10 may be maintained at a high vacuum to prevent process defects that may be caused by contaminants such as particles during plasma reaction.

An antenna electrode ANT, a dimple plate DIP, and an electrostatic chuck 14 may be installed in the process chamber 10. The antenna electrode ANT and the electrostatic chuck 14 may be used as a first electrode and a second electrode, respectively, and may be installed opposite to each other. A dimple plate DIP that may adjust plasma density may be coupled to (or assembled with) the antenna electrode ANT. Combination (or assembly) of the antenna electrode ANT and the dimple plate DIP may be performed using a dimple plate precision adjustment device as described below.

A high-frequency power source 30 that applies high-frequency power (e.g., radio frequency (RF) power) is connected to the antenna electrode ANT through an impedance matcher 28. The high frequency power applied through the high frequency power source 30 may be power having a frequency of about 27 MHz or higher. For example, the high frequency power applied by the high frequency power source 30 may be power with a frequency of about 60 MHz.

A substrate 12, for example, a wafer, may be mounted on the electrostatic chuck 14. The wafer may be a large wafer with a diameter of about 300 mm. The wafer may be a silicon wafer. A bias power source 34 that applies high-frequency power through an impedance matcher 32 may be connected to the electrostatic chuck 14.

The high frequency power applied by the bias power source 34 may be power having a frequency of about 100 KHz to about 10 MHz. For example, the high-frequency power applied by the bias power source 34 may be power with a frequency of about 2 MHz. Some implementations do not include one or both of the impedance matchers 28 and 32.

The process gas injected into the process chamber 10 may be turned into plasma by a plasma applicator 40. The plasma applicator 40 may include the high-frequency power source 30 electrically connected to the antenna electrode ANT.

When power is applied to the antenna electrode ANT by the high-frequency power source 30, the process gas injected into the process chamber 10 may be converted into plasma. When high-frequency or low-frequency power is applied to the electrostatic chuck 14 by the bias power source 34, the plasma generated in the process chamber 10 may be more effectively guided toward the substrate 12.

Figure 2:
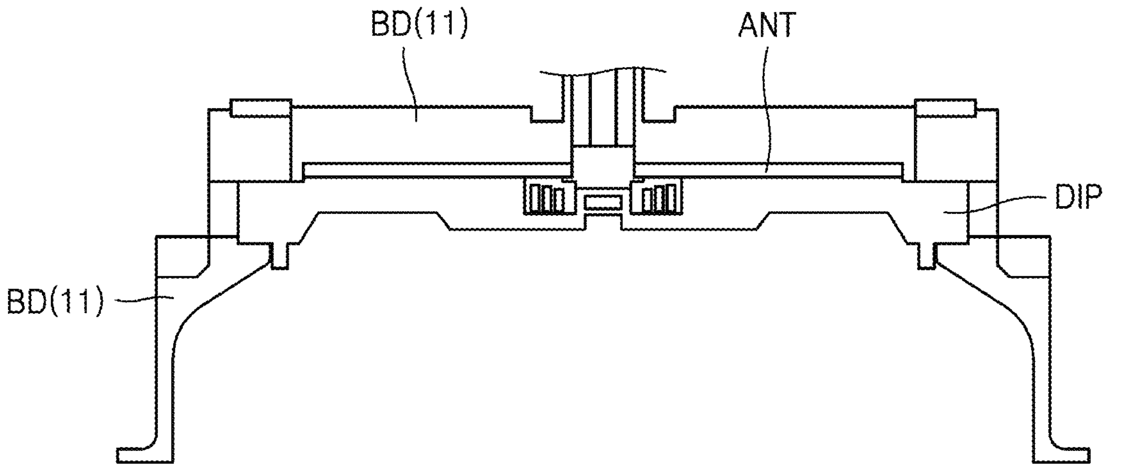
FIG. 2 is a cross-sectional view showing an example of an antenna electrode and a dimple plate of a plasma processing apparatus.

FIG. 2 is a cross-sectional view showing an antenna electrode and a dimple plate of a plasma processing apparatus, for example, the plasma processing apparatus of FIG. 1.

FIG. 1 shows, as an example, that the antenna electrode ANT included in the plasma processing apparatus (PTA in FIG. 1) is separated from the body 11 of the chamber 10. In some implementations, as shown in FIG. 2, the antenna electrode ANT may be coupled to (e.g., in contact with or adjacent to) a body BD of the chamber (10 in FIG. 1). The body BD in FIG. 2 may correspond to the body 11 of the chamber (10 in FIG. 1).

The dimple plate DIP may be coupled (or assembled) to a lower portion of the antenna electrode ANT. The lower portion of the dimple plate DIP may be supported by the body BD located on the sidewall of the chamber (10 in FIG. 1). The dimple plate DIP may locally control plasma density in combination with the antenna electrode ANT.

Figure 3:
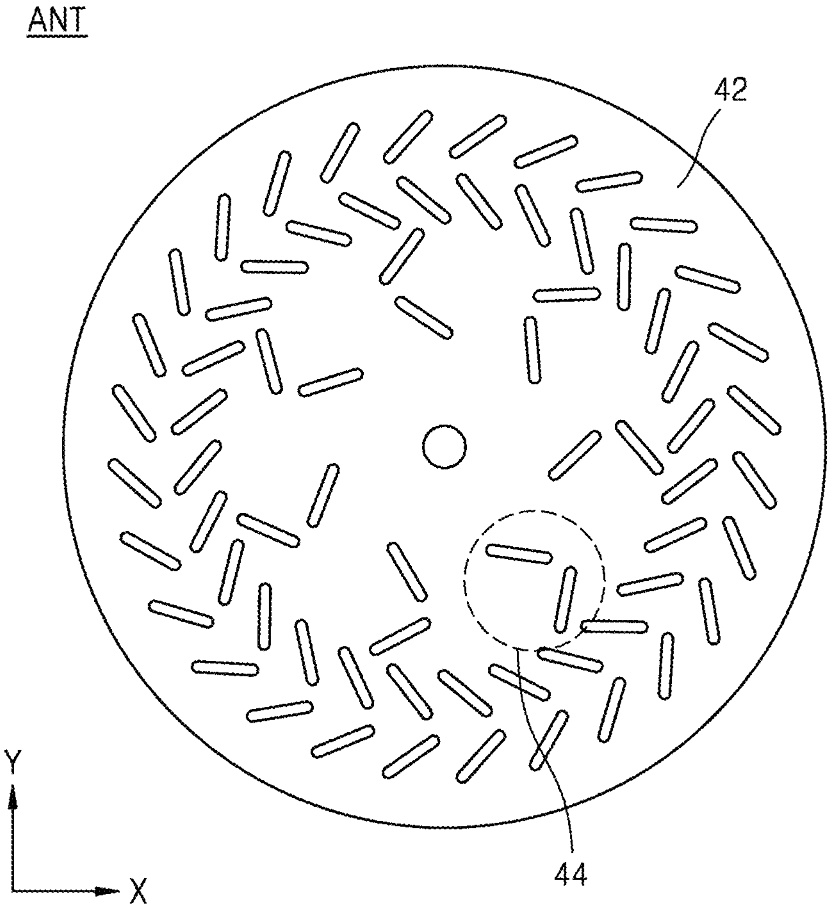
FIG. 3 is a plan view showing the antenna electrode of FIG. 2.
Figure 4:
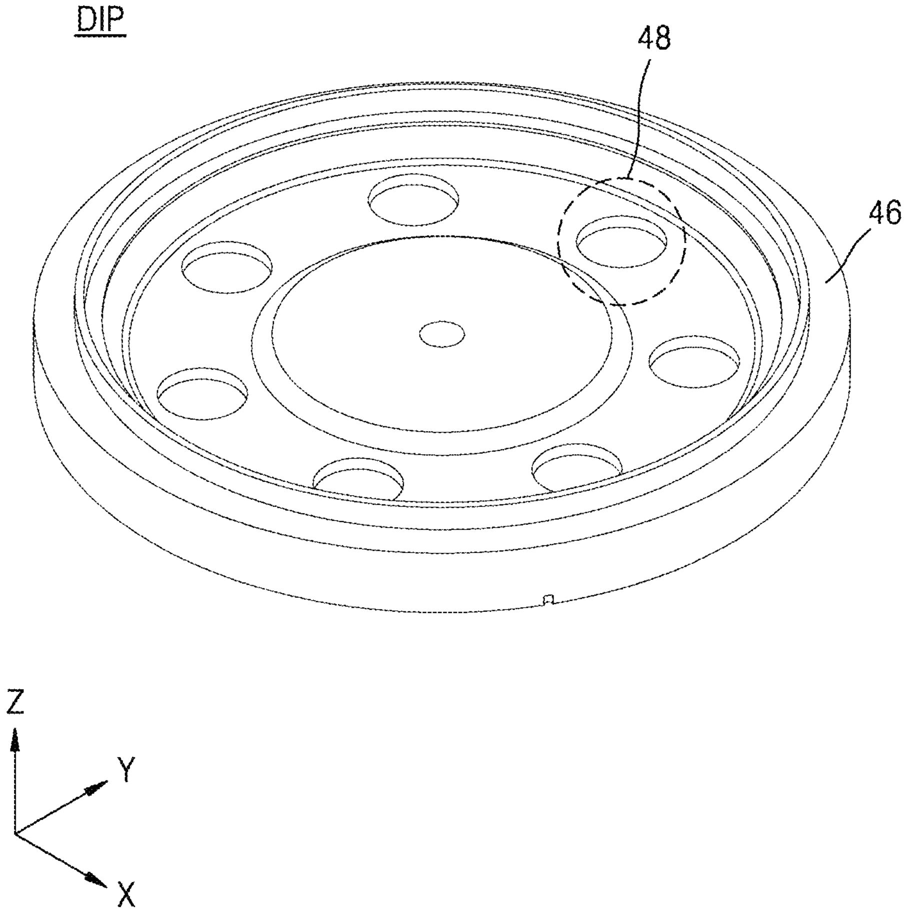
FIG. 4 is a perspective view showing the dimple plate of FIG. 2.
Figure 5:
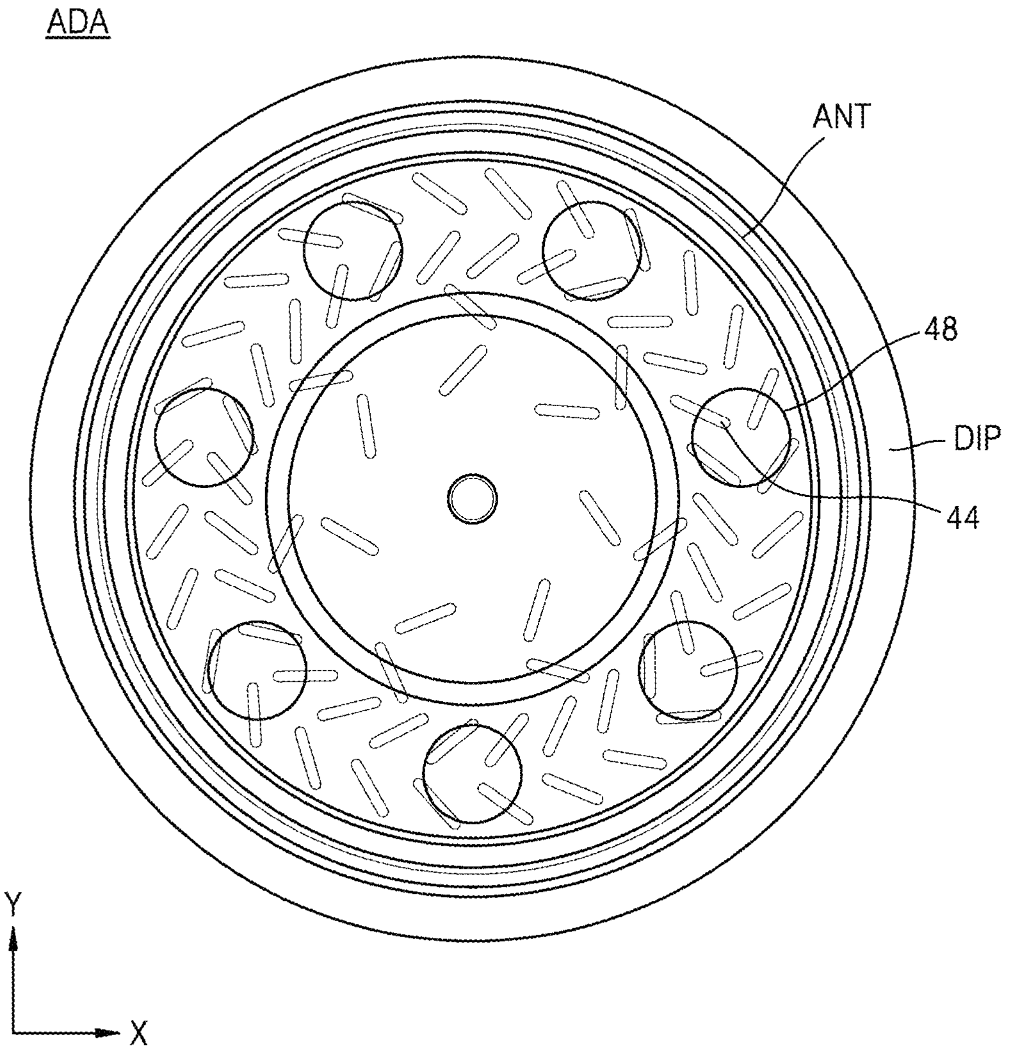
FIG. 5 is a plan view showing an assembled structure including the antenna electrode and dimple plate of FIG. 2.

FIG. 3 is a plan view showing an antenna electrode ANT of FIG. 2, FIG. 4 is a perspective view showing a dimple plate DIP, and FIG. 5 is a plan view showing an assembled structure in which the antenna electrode ANT and dimple plate DIP are assembled. The antenna electrode ANT and dimple plate DIP of FIGS. 3-5 can be, for example, the antenna electrode ANT and dimple plate DIP of FIG. 2.

As shown in FIG. 3, the antenna electrode ANT may include a disc-shaped electrode body 42 and a plurality of slits 44 formed in the disc-shaped electrode body 42. The plurality of slits 44 may be arranged to be spaced apart from each other within the disk-shaped electrode body 42. The slits 44 may be arranged to be spaced apart from each other in the circumferential direction within the disk-shaped electrode body 42. For example, the slits 44 may be arranged along inner circumference(s) of the disk-shaped electrode body 42 and can be spaced apart from each other along the inner circumference(s).

As shown in FIG. 4, the dimple plate DIP may include a cylindrical dimple body 46 and a plurality of dimple pockets 48 formed within the cylindrical dimple body 46. The dimple plate DIP may weigh approximately 12 kg. The dimple plate DIP may be made of glass (e.g., quartz). The plurality of dimple pockets 48, for example, seven, may be installed in the cylindrical dimple body 46 in the circumferential direction. For example, the dimple pockets 48 may be arranged along an inner circumference of the cylindrical dimple body 46 and can be spaced apart from each other along the inner circumference.

FIG. 5 shows an assembled structure ADA in which the dimple plate DIP is assembled on the antenna electrode ANT. As shown in FIG. 5, the slits 44 of the antenna electrode ANT may be disposed to overlap the dimple pockets 48 of the dimple plate DIP. For example, the slits 44 of the antenna electrode ANT may be aligned at least partially within the dimple pockets 48 of the dimple plate DIP along the illustrated Z direction. This alignment may permit the dimple plate DIP to locally control the plasma density in combination with the antenna electrode ANT.

For at least this reason, the relative position of the dimple plate DIP with respect to the antenna electrode ANT may be important. A dimple plate precision adjustment device may adjust the relative position of the dimple plate DIP mounted on the electrode ANT. In some cases, the dimple plate DIP is made of glass and may be broken or damaged if not properly adjusted or if not properly positioned, so the dimple plate precision adjustment device can improve reliability of the plasma processing apparatus.

Figure 6:
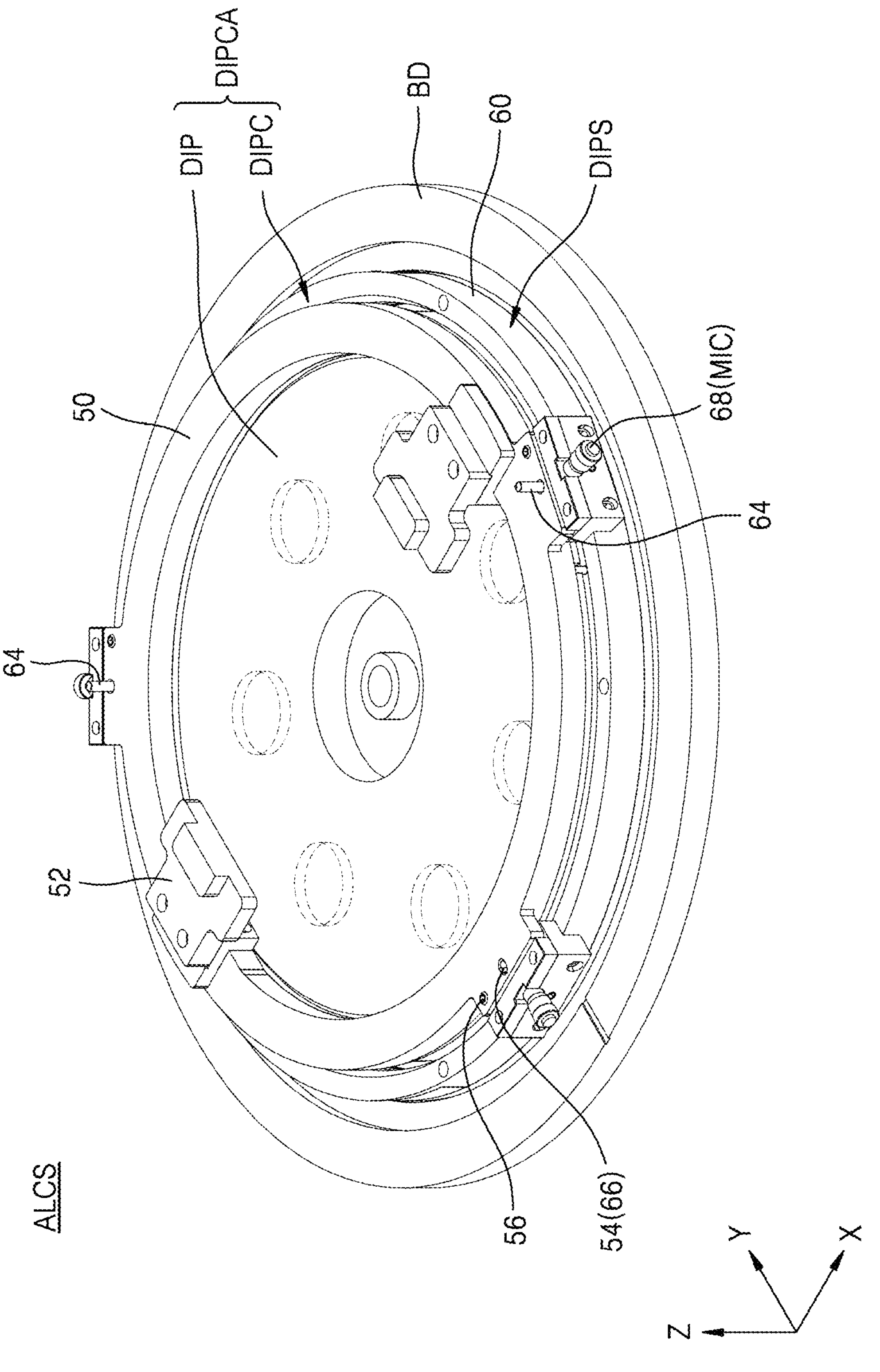
FIG. 6 is a perspective view showing an example of a dimple plate precision adjustment device.
Figure 7:
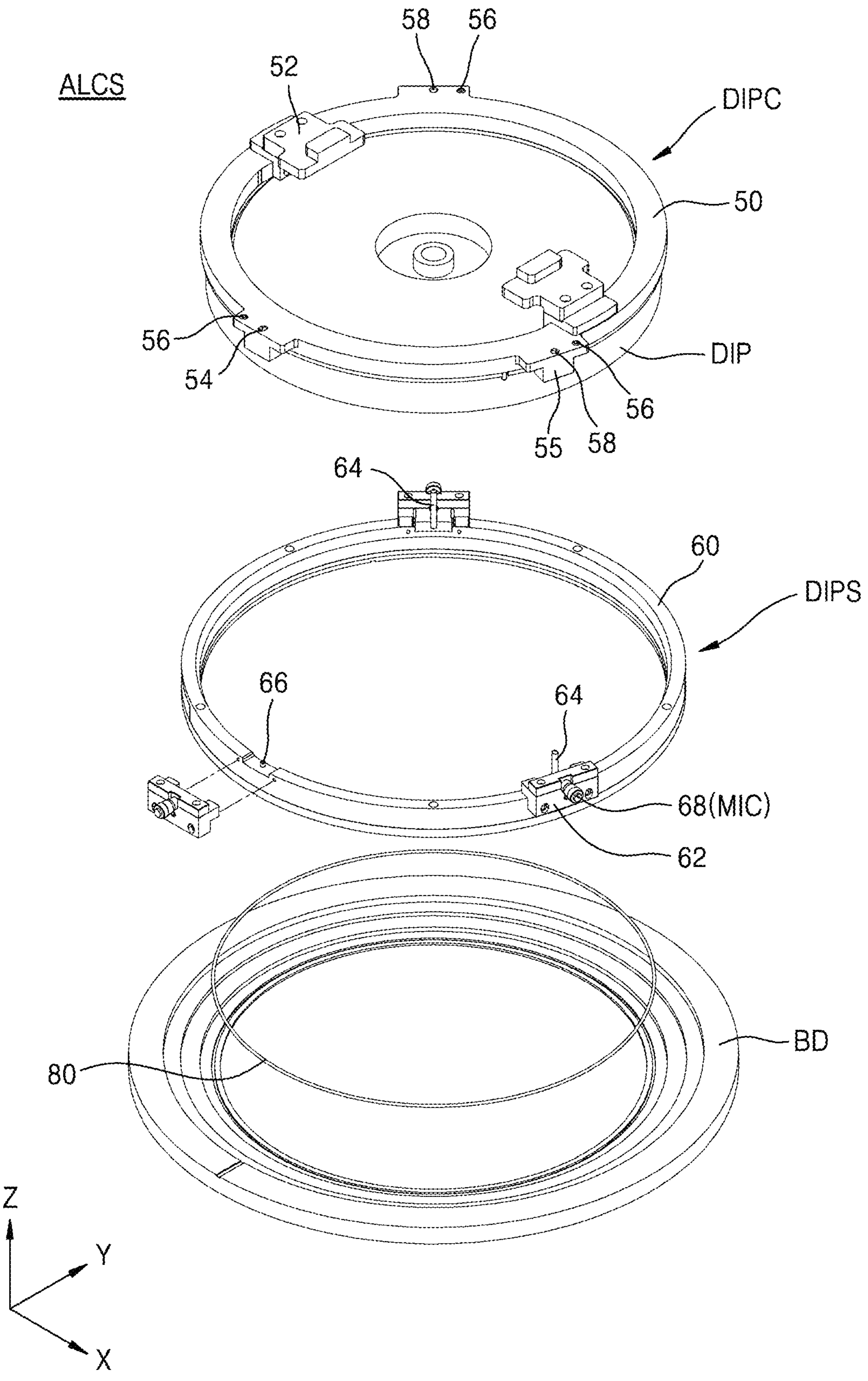
FIG. 7 is an exploded perspective view of the dimple plate precision adjustment device of FIG. 6.
Figure 8:
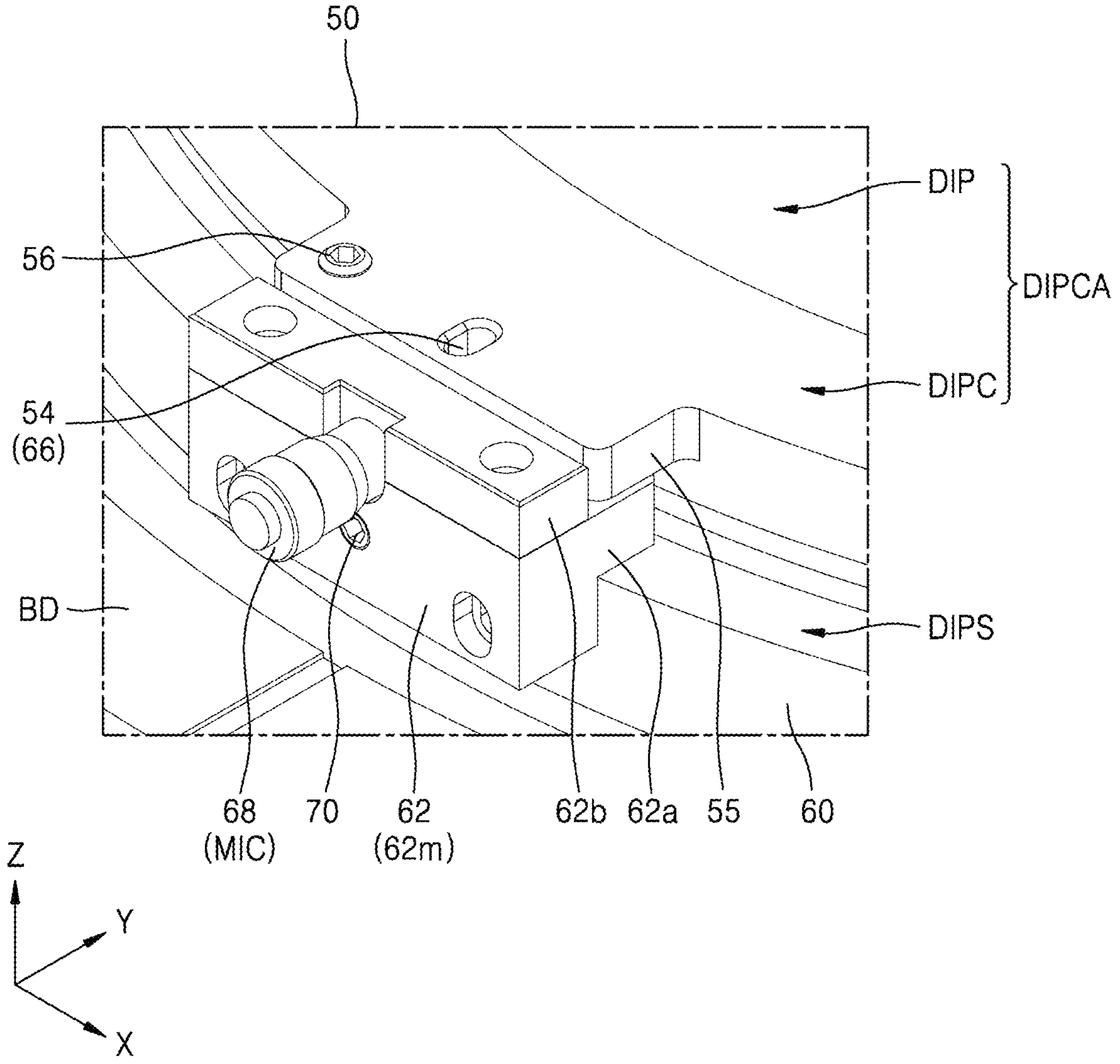
FIG. 8 is a partial enlarged view of the dimple plate precision adjustment device of FIG. 6.

FIG. 6 is a perspective view showing a dimple plate precision adjustment device according to some implementations, FIG. 7 is an exploded perspective view of the dimple plate precision adjustment device of FIG. 6, and FIG. 8 is a partial enlarged view of the dimple plate precision adjustment device of FIG. 6. In FIGS. 6 and 7, for convenience, the antenna electrode that may be located below the body BD is not shown.

A dimple plate precision adjustment device ALCS may be a dimple plate centering precision adjustment device (or dimple plate centering jig) that adjusts the center of the dimple plate DIP. As shown in FIG. 6, the dimple plate precision adjustment device ALCS may include a dimple carrier assembly DIPCA, a dimple spacer DIPS, and a plurality of gap measurers MIC.

The dimple carrier assembly DIPCA, the dimple spacer DIPS, and the gap measurers MIC may be mounted on the body BD. An O-ring 80 may be located at the lower portion of the body BD. In FIG. 7, for simplicity, the body BD is shown positioned below the O-ring 80.

The dimple carrier assembly DIPCA may include a dimple plate DIP and a dimple carrier DIPC coupled to the dimple plate DIP. The dimple plate DIP may be made of glass so that the dimple pockets (e.g., dimple pockets 48 shown in FIGS. 4 and 5) may be visible through the dimple plate DIP. FIGS. 6 and 7 show a glass cover disposed on the upper surface of the dimple plate DIP.

The dimple carrier DIPC may include a cylindrical carrier body 50, a plurality of traction members 52 installed on the carrier body 50, and a plurality of protruding members 55 (labeled in FIG. 7) that protrude outward and downward from the cylindrical carrier body 50.

The plurality of traction members 52, for example, two, may be arranged symmetrically to each other in the circumferential direction (e.g., may be evenly-spaced along the circumferential direction). The traction members 52 may be disposed to extend inside the disc-shaped dimple plate DIP, e.g., radially inward from the carrier body 50. A traction device is connected to the traction members 52 to move the dimple plate DIP, which may be heavy and fragile.

The plurality of protruding members 55, for example, three, may be arranged at regular intervals in the circumferential direction. The protruding members 55 may be configured to be T-shaped in cross-section. A front alignment hole 54 and a height adjustment pusher 56 on one side of the front alignment hole 54 may be installed in one or more protruding members 55, e.g., a protruding member 55 located on the front-left side as shown in FIG. 6.

Alignment guide holes 58 may be formed in one or more protruding members 55, e.g., the protruding members 55 on the front right and rear sides as shown in FIG. 6. Height adjustment pushers 56 may be installed on one side of the alignment guide holes 58. The height adjustment pushers 56 can adjust the height of the dimple carrier DIPC up and down, that is, in the Z direction.

The dimple spacer DIPS may be combined with (e.g., installed with) the dimple carrier assembly DIPCA. The dimple spacer DIPS may include a cylindrical spacer body 60, a front alignment pin 66 installed on the spacer body 60, and a plurality of alignment guide pins 64.

The alignment guide pins 64 may be disposed on the front right and rear sides of the spacer body 60. The alignment guide pins 64 may be inserted into the alignment guide holes 58 installed in the protruding members 55 of the dimple carrier DIPC. The front alignment pin 66 may be installed on the front left side of the spacer body 60.

The plurality of gap measurers MIC may be installed in the dimple spacer DIPS in the circumferential direction, e.g., at an outer circumference of the dimple spacer DIPS. The gap measurers MIC may be micrometer instruments that may precisely measure length using the principle of a screw. Three gap measurers MIC may be installed spaced apart from each other in the circumferential direction. The gap measurers MIC may measure a gap between the dimple spacer DIPS and the dimple carrier assembly DPICA. The gap measurers MIC may measure a gap between the dimple spacer DIPS and the dimple plate DIP. The gap measurers MIC may measure the gap between measuring bodies 62 and the dimple carrier DIPC.

The gap measurers MIC may be installed close to the front alignment pin 66 and the alignment guide pins 64. The gap measurers MIC may include the measuring bodies 62 and control knobs 68. The measuring bodies 62 may include a main portion **62*m* (labeled in FIG. 8) supported on one sidewall of the spacer body 60, a shelf portion 62*a* extended from the main portion 62*m* to the upper surface of the spacer body 60, and a cap portion 62*b* installed on the shelf portion 62*a* and facing the protruding members 55 connected to the carrier body 50**.

The measuring bodies 62 may be installed in contact with the spacer body 60. The shelf portions **62*a* of the measuring bodies 62 on the spacer body 60 may contact the protruding members 55** of the dimple carrier DIPC.

A plurality of gap adjustment pushers 70 may be installed on the measuring bodies 62 below the control knobs 68. The gap adjustment pushers 70 may adjust the gap between the measuring bodies 62 of the gap measurers MIC and the dimple carrier DIPC, e.g., between the measuring bodies 62 and the protruding members 55. The gap adjustment pushers 70 may adjust a horizontal distance (or horizontal gap) between the measuring bodies 62 of the gap measurers MIC and the protruding members 55 of the dimple carrier DIPC.

When adjusting the gap between the measuring body 62 and the protruding members 55 of the dimple carrier DIPC using gap adjustment pushers 70, the center of the dimple plate DIP on the body BD may be precisely controlled. In this case, as described above, the antenna electrode ANT and the dimple pockets 48 of the dimple plate DIP may be aligned. Accordingly, the slits 44 of the antenna electrode (e.g., ANT shown in FIGS. 2 and 3) are aligned with the dimple pockets (e.g., dimple pockets 48 shown in FIG. 4) of the dimple plate DIP to locally control the plasma density.

FIGS. 9A to 12C are diagrams sequentially illustrating a dimple plate precision adjustment method using a dimple plate precision adjustment device, for example, the dimple plate precision adjustment device illustrated in FIGS. 6-8. In FIGS. 9A to 12C, descriptions already given with reference to FIGS. 6 to 8 are briefly given or omitted. In FIGS. 9A to 12C, the antenna electrode located below the body BD is not shown for convenience.

Figure 9A:
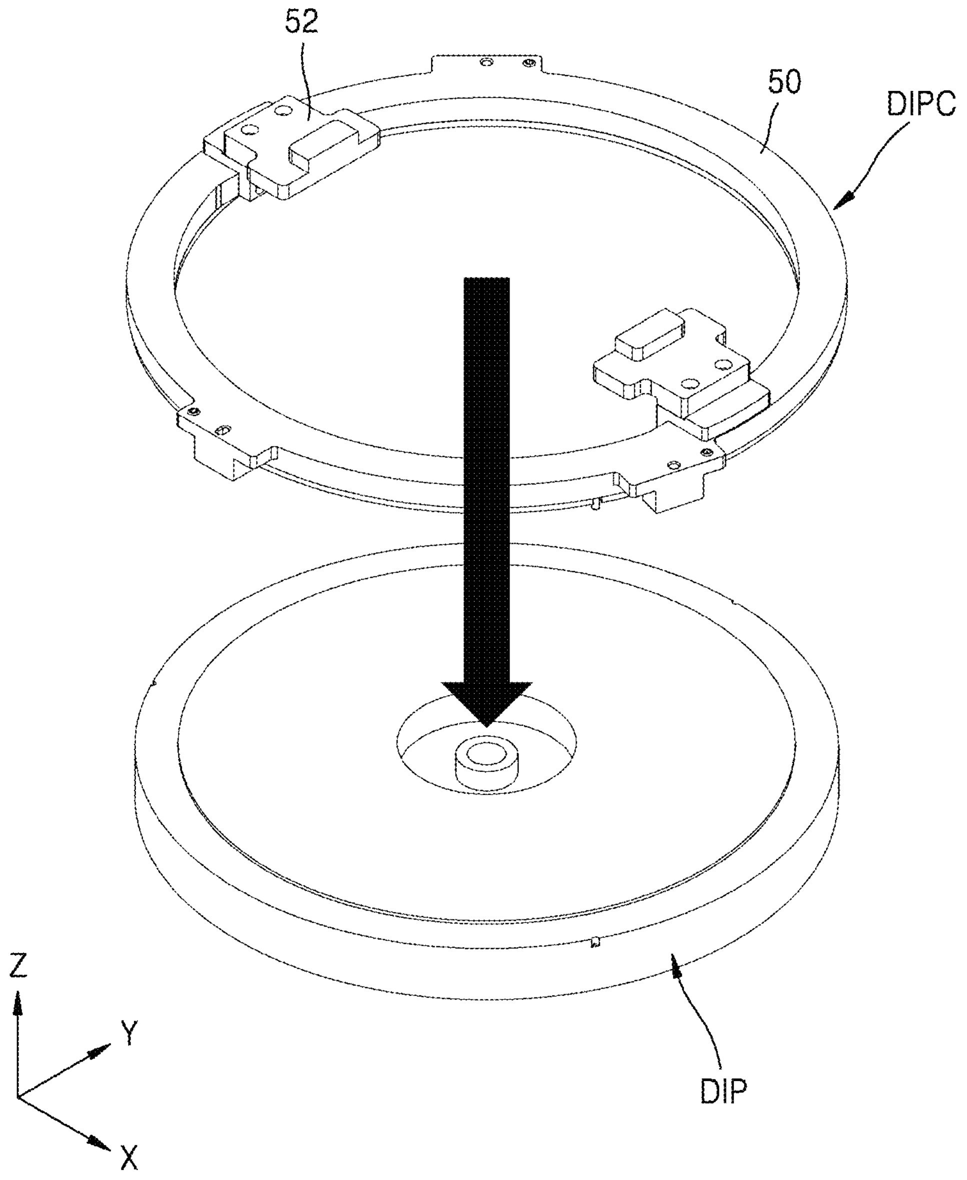
FIGS. 9A to 12C are diagrams illustrating an example of a dimple plate precision adjustment method.
Figure 9B:
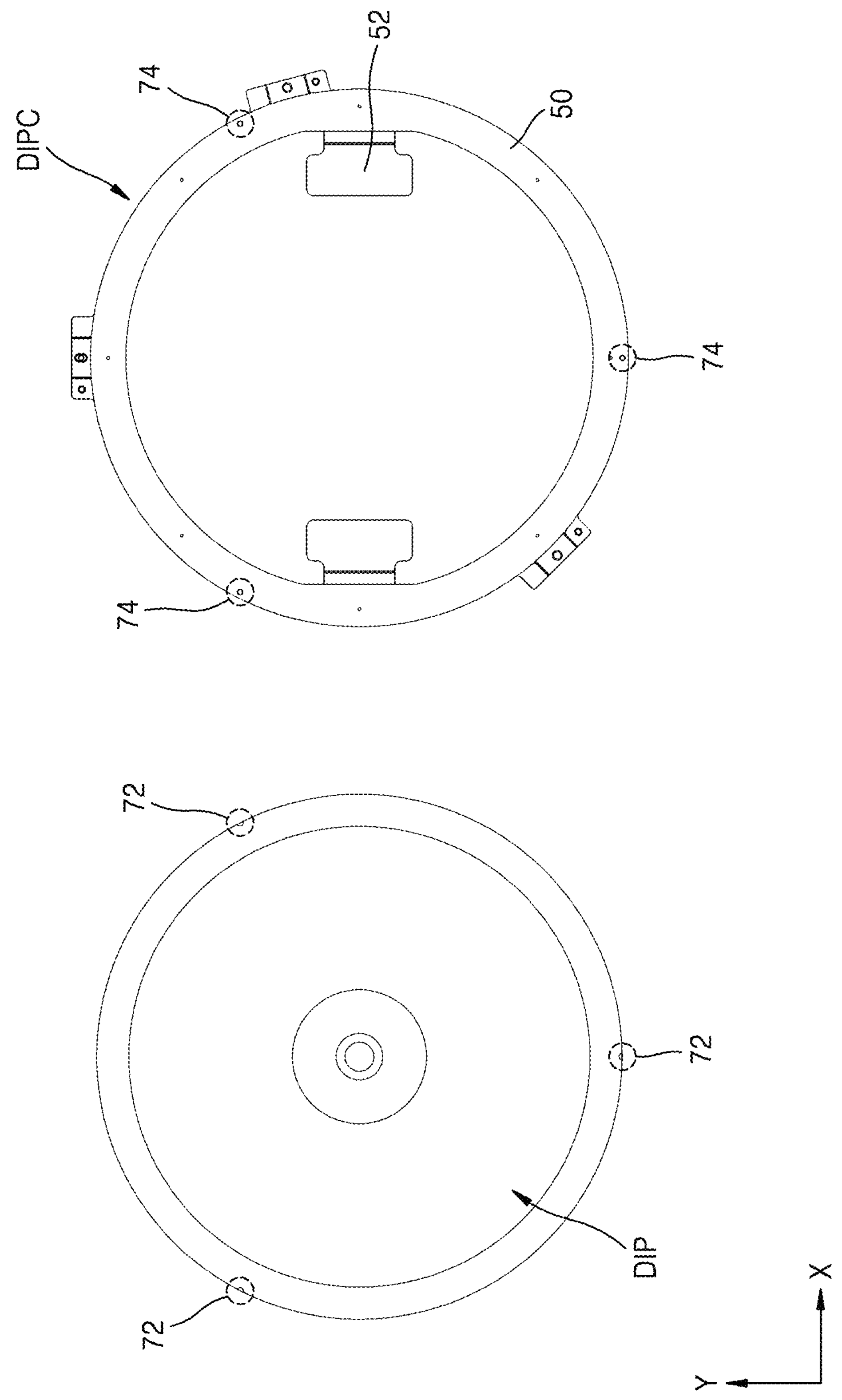
Figure 9C:
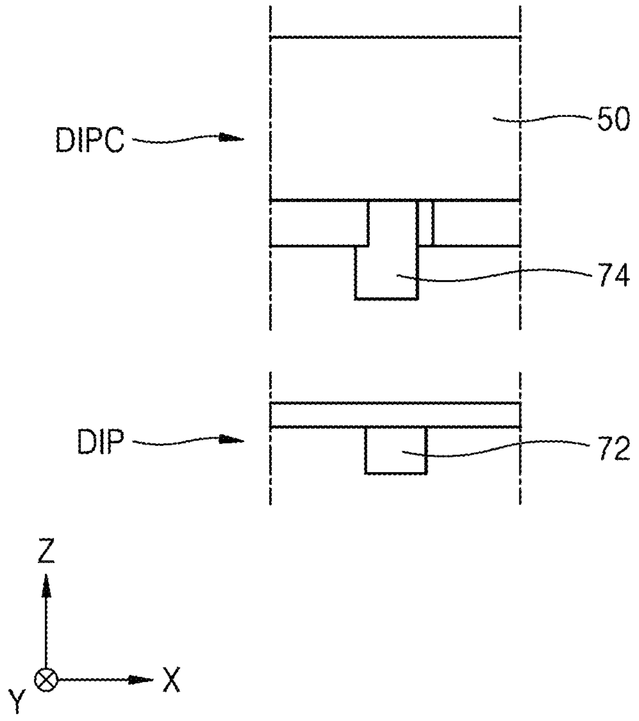

FIGS. 9A to 9C illustrate a process of assembling a dimple plate DIP and a dimple carrier DIPC. FIG. 9A is a perspective view illustrating that the dimple carrier DIPC is mounted on the dimple plate DIP. FIG. 9B is a top view of a dimple plate DIP and a dimple carrier DIPC. FIG. 9C is a cross-sectional view illustrating the alignment of dimple alignment holes 72 of the dimple plate DIP with alignment pins 74 of the dimple carrier DIPC.

First, as shown in FIG. 9B, a disc-shaped dimple plate DIP is provided. The dimple plate DIP may be provided with the plurality of dimple alignment holes 72 at the circumference (e.g., outer edge) of the dimple plate DIP.

As shown in FIG. 9B, a cylindrical dimple carrier DIPC is provided. The dimple carrier DIPC may include a plurality of traction members 52 installed on a cylindrical carrier body 50. The dimple carrier DIPC has the alignment pins 74 installed along a circumferential direction of the dimple carrier DIPC.

As shown in FIG. 9A, the dimple carrier DIPC is placed on the dimple plate DIP. As shown in FIG. 9C, the dimple carrier DIPC is placed on the dimple plate DIP so that the alignment pins 74 of the dimple carrier DIPC are placed in line with the dimple alignment holes 72 of the dimple plate DIP (e.g., along the Z direction). In this process, care may be taken to avoid damaging the dimple plate DIP.

Figure 10A:
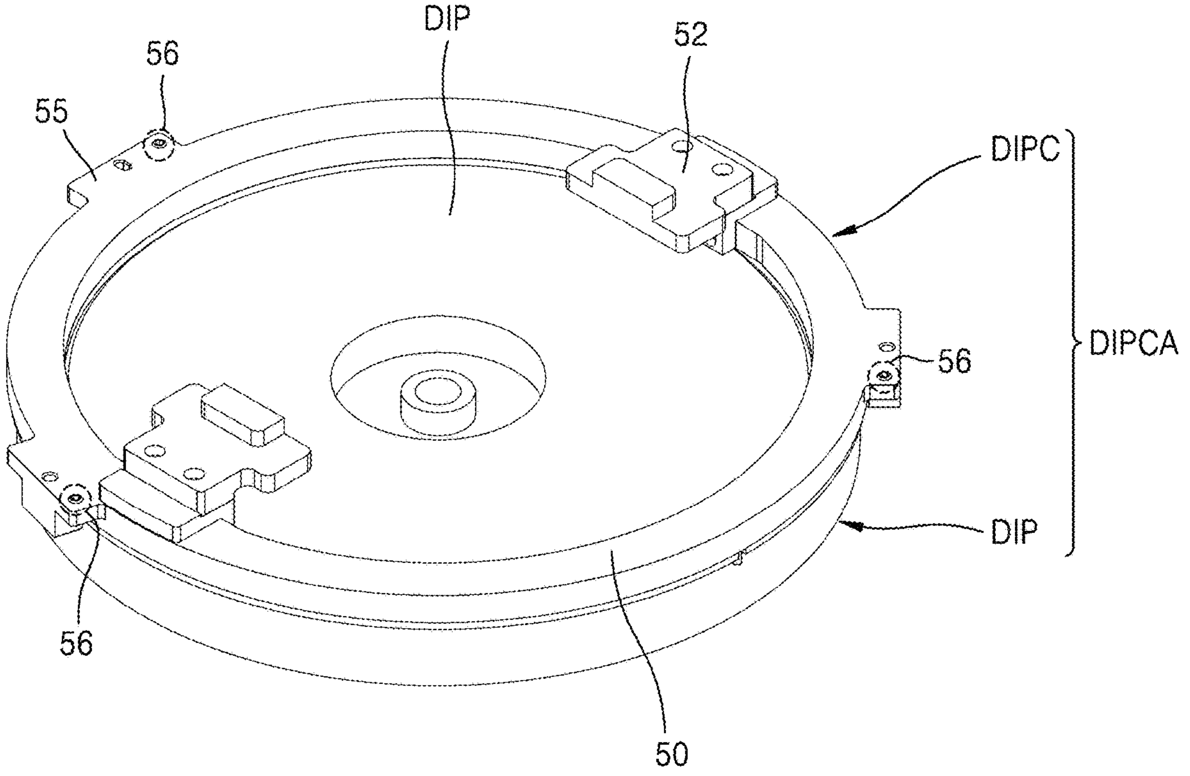
Figure 10B:
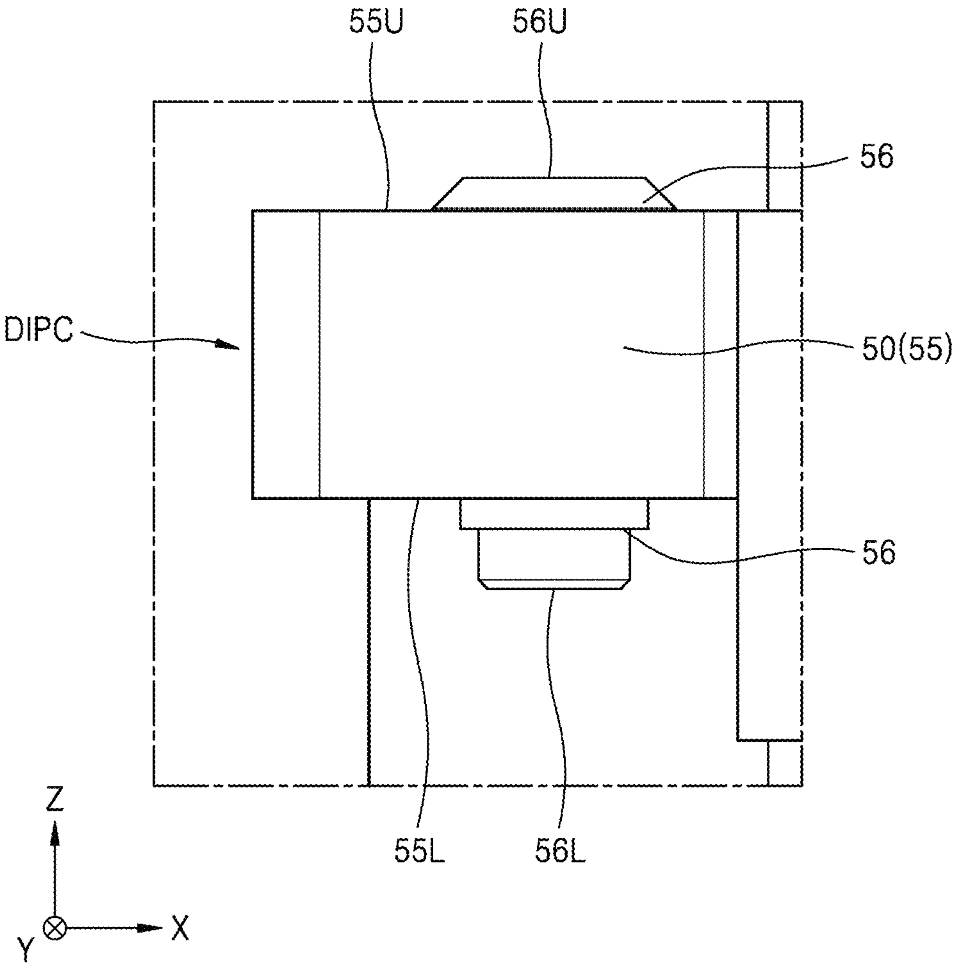

FIGS. 10A and 10B illustrate a process of setting an initial height of the dimple carrier DIPC. FIG. 10A is a perspective view showing a configuration in which the dimple carrier DIPC is mounted on the dimple plate DIP. FIG. 10B is a cross-sectional view showing the height adjustment pusher 56 installed on the protruding member 55 of the carrier body 50 of the dimple carrier DIPC.

As shown in FIG. 10A, the dimple carrier assembly DIPCA includes the dimple carrier DIPC mounted on the dimple plate DIP as described with respect to FIGS. 9A-9C. As described above, the dimple carrier DIPC may include the carrier body 50, the traction members 52, and the protruding members 55. In addition, the dimple carrier DIPC may include the height adjustment pushers 56 installed on the protruding members 55.

As shown in FIG. 10B, lower surfaces 56L of the height adjustment pushers 56 protrude lower than the lower surfaces 55L of the protruding members 55 of the dimple carrier DIPC, and the upper surfaces 56U of the height adjustment pushers 56 are a little higher than the upper surfaces 55U of the protruding members 55.

In example, the dimple plate DIP may be spaced apart in the vertical direction from the body (BD shown in FIG. 6). This configuration can provide a free space for the O-ring located below the dimple carrier DIPC and the dimple plate DIP, to prevent or reduce damage to the O-ring.

In addition, in some implementations, when the dimple plate DIP is spaced vertically from the body (BD shown in FIG. 6), damage to the dimple plate DIP may be prevented when adjusting the gap between the dimple spacer DIPS and the dimple plate DIP, as described below.

Figure 11A:
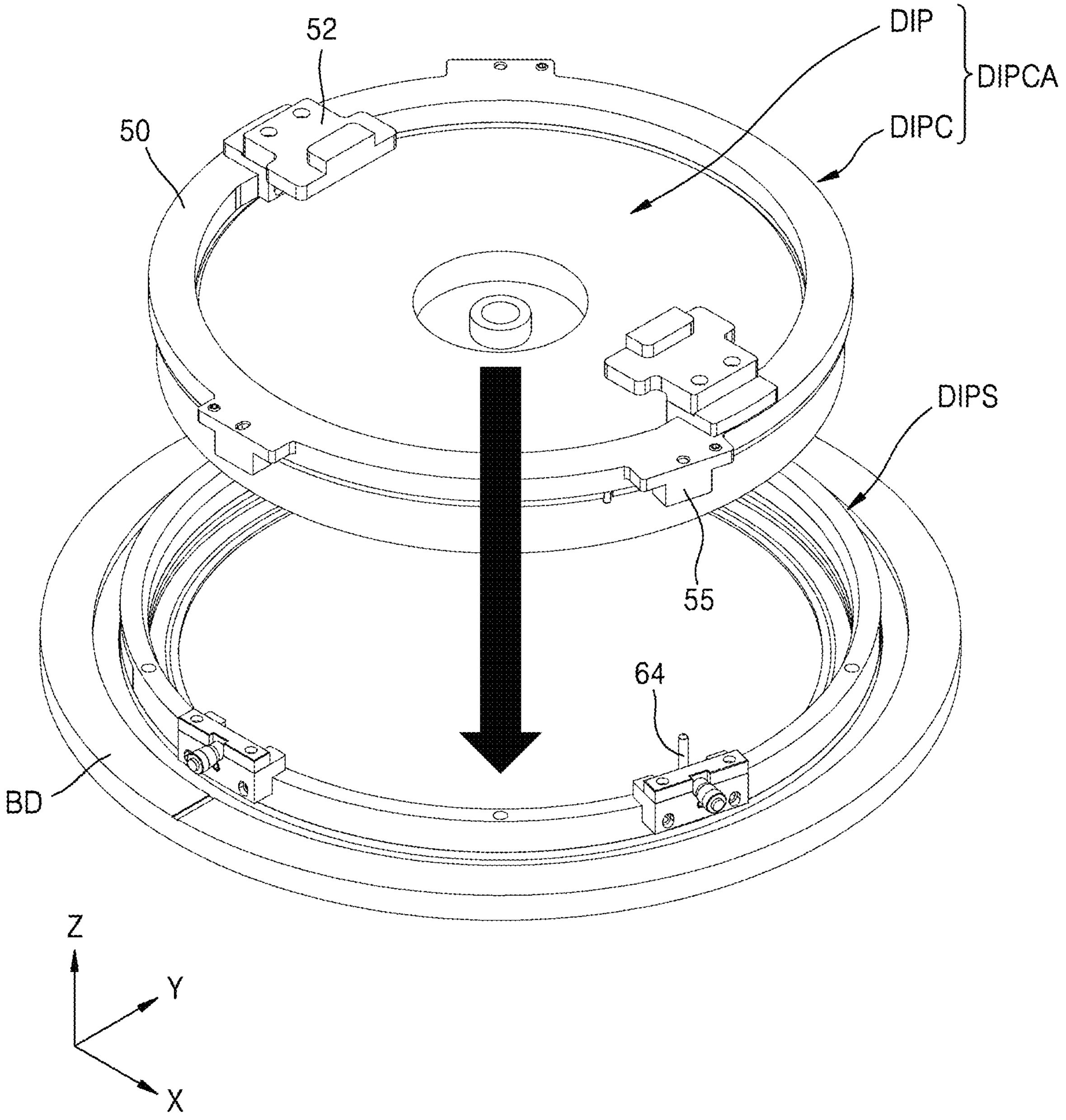
Figure 11B:
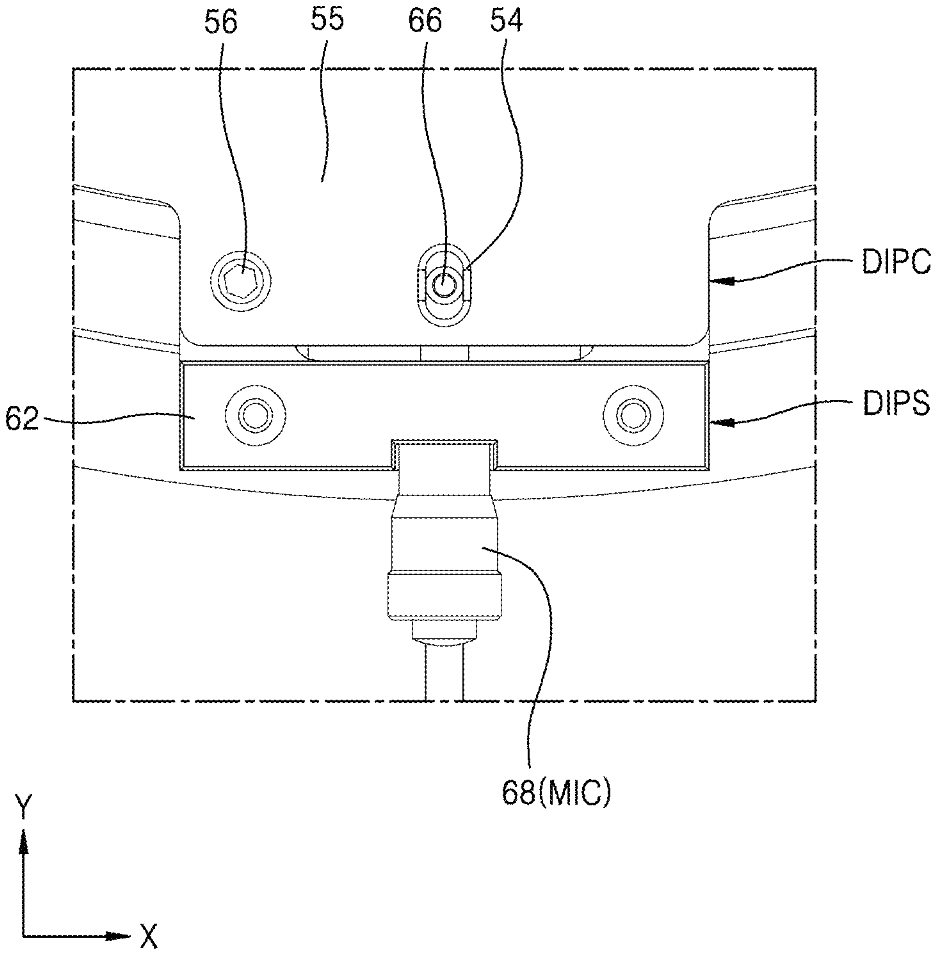
Figure 11C:
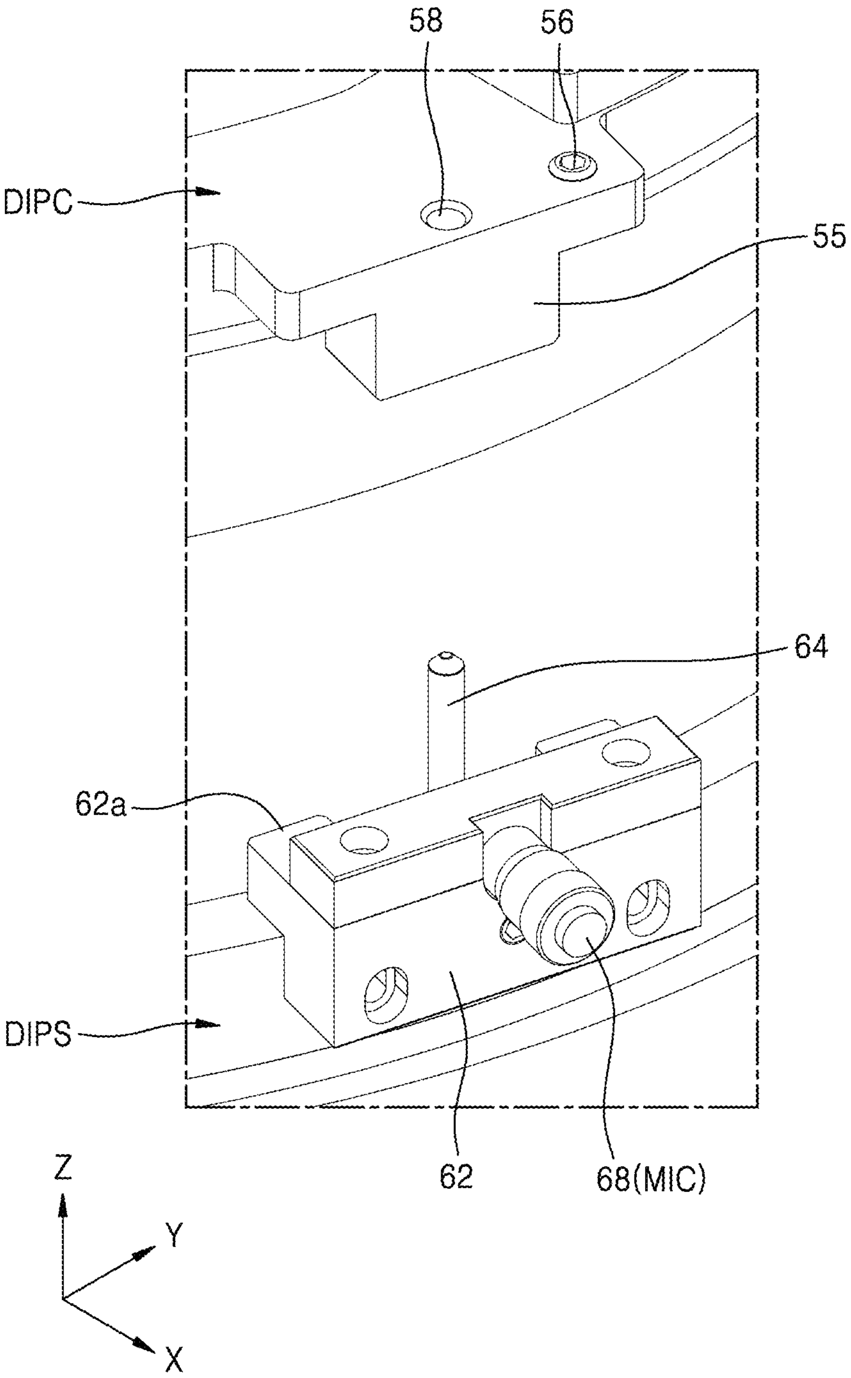

FIGS. 11A to 11C illustrate a process of mounting the dimple carrier assembly DIPCA on the dimple spacer DIPS on the body BD. FIG. 11A is a perspective view showing the process of mounting the dimple carrier assembly DIPCA on the dimple spacer DIPS on the body BD.

FIG. 11B is a plan view illustrating horizontal alignment between the dimple carrier DIPC and the dimple spacer DIPS. FIG. 11C is a cross-sectional view illustrating vertical alignment of the dimple carrier DIPC and the dimple spacer DIPS.

As shown in FIG. 11A, the dimple carrier assembly DIPCA is mounted on the dimple spacer DIPS on the body BD. When mounting the dimple spacer DIPS and dimple carrier assembly DIPCA, the front alignment hole 54 of the dimple carrier DIPC and the front alignment pin 66 installed on the dimple spacer DIPS are aligned and mounted with one another as shown in FIG. 11B. Accordingly, as shown in FIG. 11B, the front alignment pin 66 may be inserted into the front alignment hole 54.

In addition, when mounting the dimple spacer DIPS and dimple carrier assembly DIPCA, the alignment guide holes 58 of the dimple carrier DIPC are aligned with the alignment guide pins 64 of the dimple spacer DIPS, as shown in FIG. 11C. When mounting the dimple spacer DIPS and dimple carrier assembly DIPCA, the height adjustment pusher 56 may be positioned in vertical alignment with the shelf portion 62*a* of the measuring bodies 62, as shown in FIG. 11C. In some implementations, after mounting the dimple spacer DIPS and dimple carrier assembly DIPCA, the alignment guide pins 64 are removed.

Figure 12A:
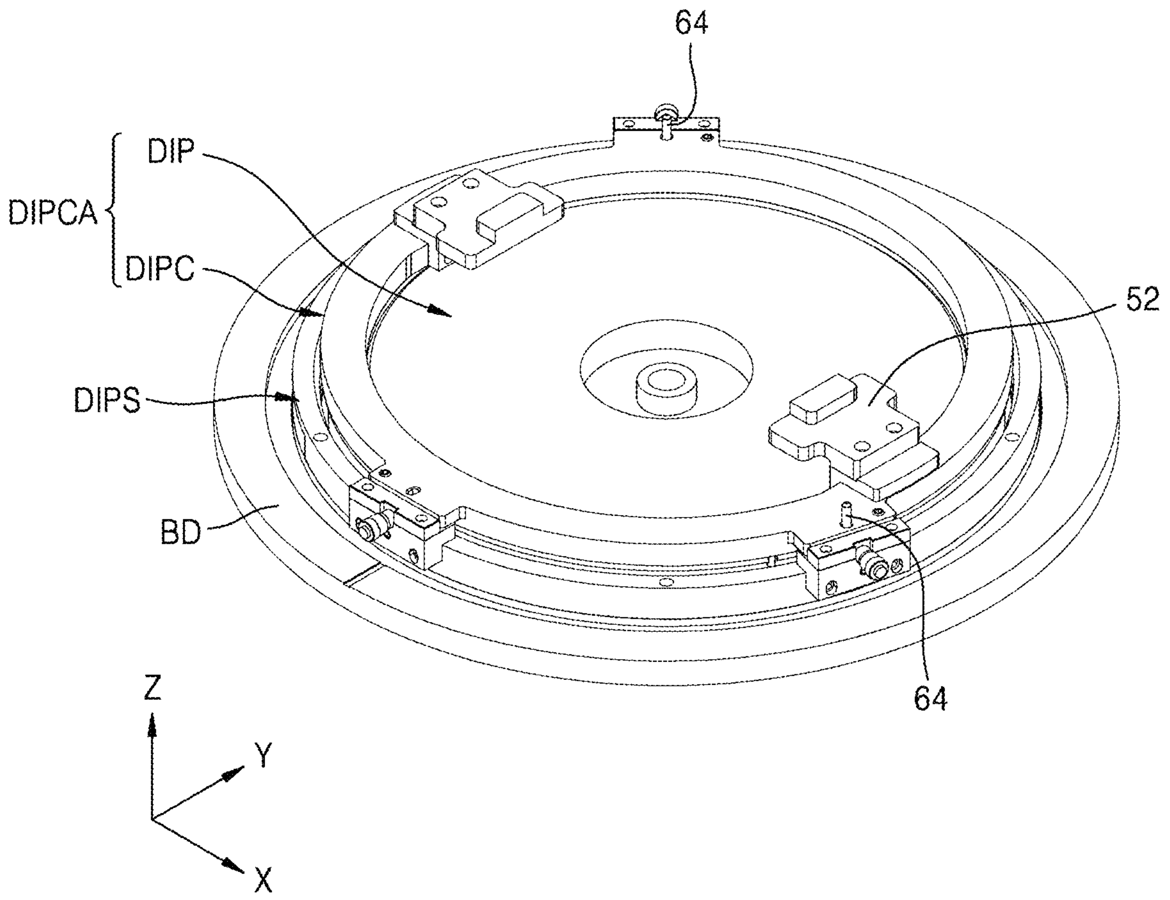
Figure 12B:
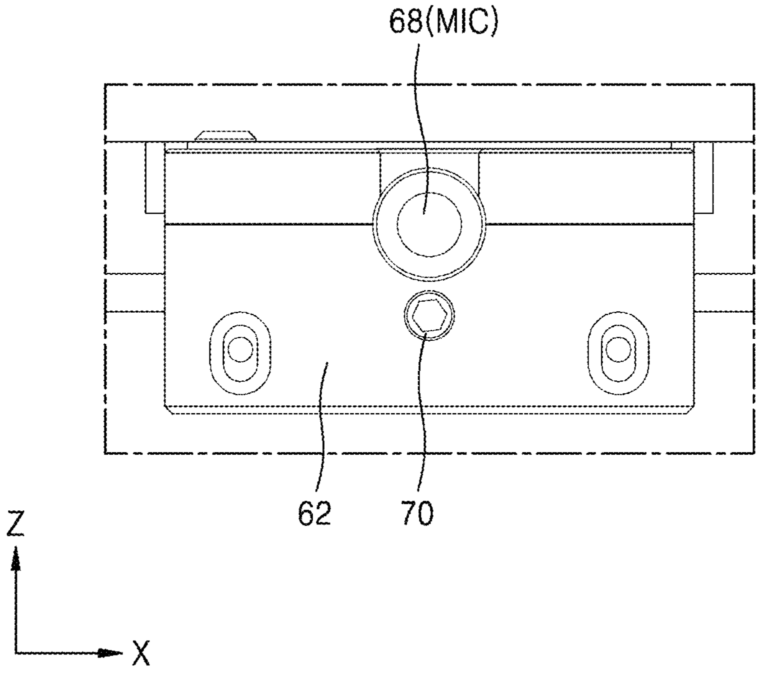
Figure 12C:
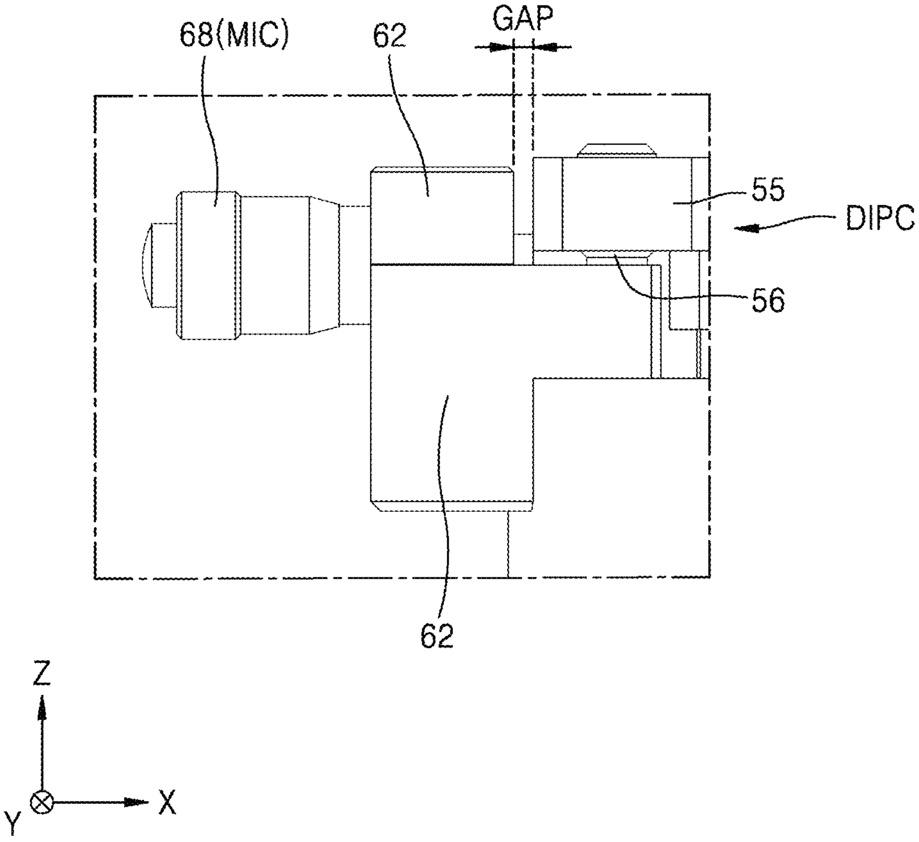

FIGS. 12A to 12C illustrate a process of mounting the dimple carrier assembly DIPCA on the dimple spacer DIPS on the body BD and adjusting the center of the dimple plate DIP.

FIG. 12A is a perspective view showing a configuration in which the dimple carrier assembly DIPCA is mounted on the dimple spacer DIPS on the body BD. FIG. 12B is a cross-sectional view showing gap measurers MIC and gap adjustment pushers 70. FIG. 12C is a cross-sectional view showing measurement of the gap GAP between the measuring bodies 62 and the dimple carrier DIPC.

As shown in FIG. 12A, the dimple carrier assembly DIPCA is mounted on the dimple spacer DIPS on the body BD. Then, as shown in FIG. 12C, the gap GAP between the measuring bodies 62 and the dimple carrier DIPC is measured using the gap measurers MIC. When measuring the gap GAP between the measuring bodies 62 and the dimple carrier DIPC, the gap between the dimple spacer DIPS and the dimple plate DIP may instead or additionally be measured.

In addition, as shown in FIGS. 12A-12B, the gap GAP between the measuring bodies 62 and the dimple carrier DIPC is adjusted using the gap adjustment pushers 70. In this way, the centering position of the dimple plate DIP within the dimple spacer DIPS may be adjusted.

In addition, the height adjustment pushers 56 described with reference to FIGS. 10A and 10B may be raised toward the upper surfaces of the protruding members 55 to seat the dimple carrier assembly including the dimple plate DIP and the dimple carrier DIPC on the dimple spacer DIPS. Through this process, the dimple plate DIP within the dimple plate spacer DIPS on the body BD may be precisely adjusted without damage.

FIGS. 13 to 17 are diagrams illustrating a dimple plate precision adjustment method using a dimple plate precision adjustment device, for example, the dimple plate precision adjustment device illustrated in FIGS. 6-8.

In reference to FIGS. 13 to 17, the description given with reference to FIGS. 6 to 8 and 9A to 12C is briefly given or omitted.

Figure 13:
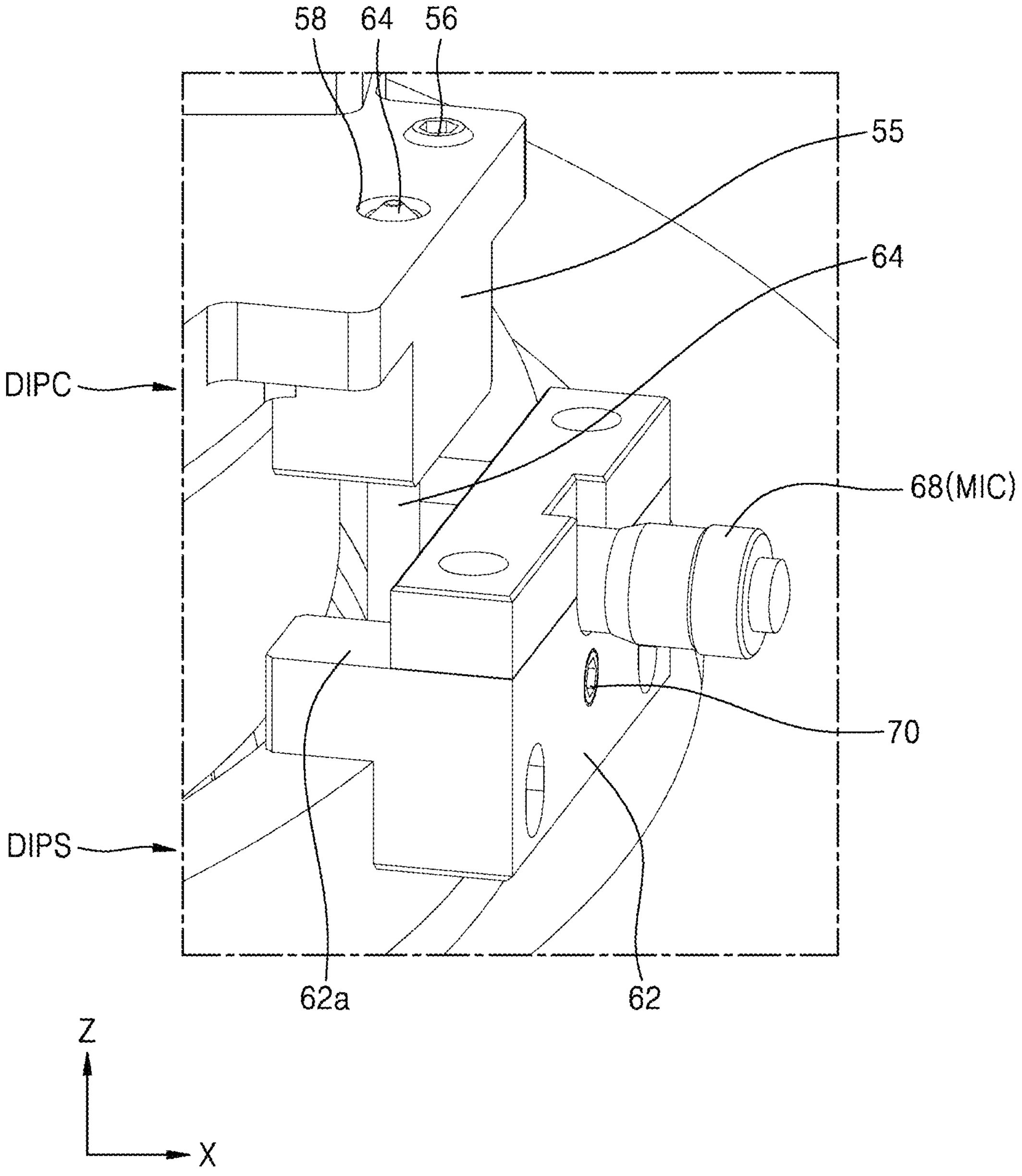
FIGS. 13 to 17 are diagrams illustrating an example of a dimple plate precision adjustment method.

Referring to FIG. 13, FIG. 13 is a cross-sectional view illustrating the mounting process between gap measurers MIC and the dimple carrier DIPC located on the dimple spacer DIPS. The dimple spacer DIPS and the dimple carrier DIPC may be vertically coupled with the alignment guide pins 64 inserted into the protruding members 55 of the dimple carrier DIPC.

The height adjustment pusher 56 installed within the protruding members 55 of the dimple carrier DIPC may be seated on the shelf portion 62*a* of the measuring body 62 of the gap measurers MIC to space the dimple carrier DIPC and the dimple spacer DIPS apart from each other.

In this way, damage to the dimple plate DIP may be avoided when vertically coupling the dimple carrier DIPC and the dimple spacer DIPS or when adjusting (or moving) the dimple carrier DIPC and the dimple spacer DIPS horizontally. In addition, damage to the O-ring may be prevented by securing free space for the O-ring located below the dimple carrier DIPC and the dimple plate DIP.

Figure 14:
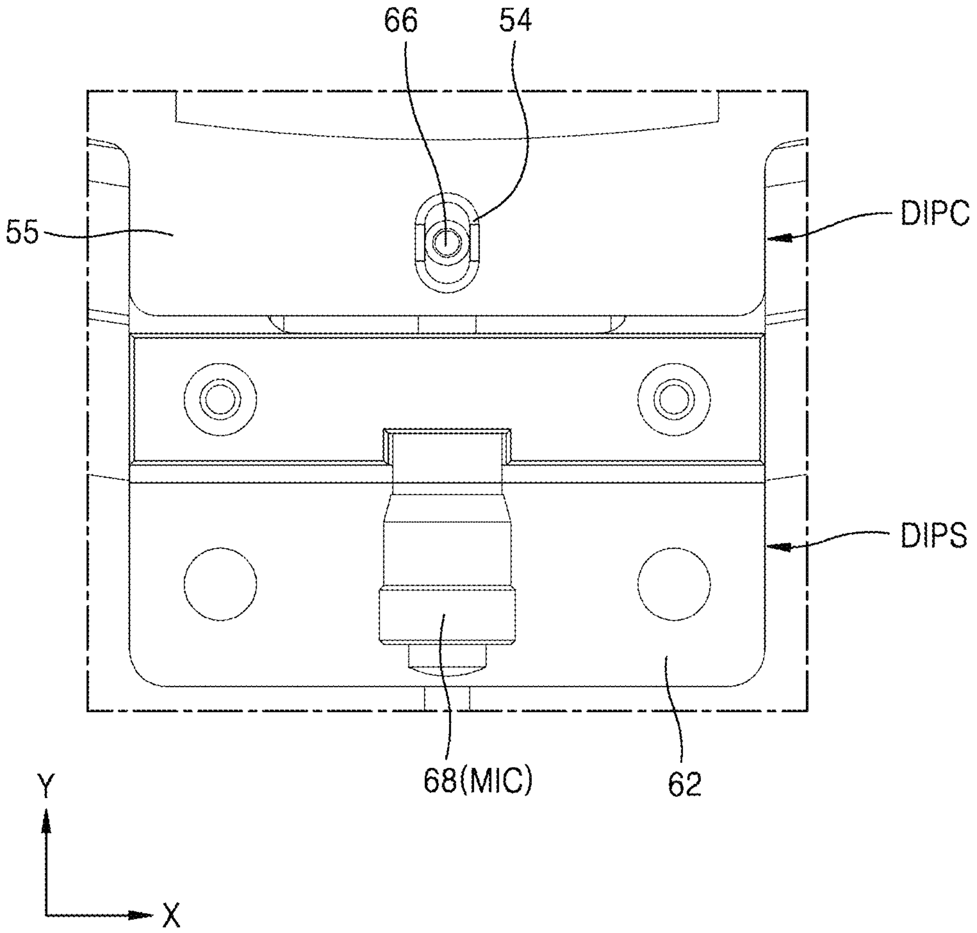

FIG. 14 is a plan view illustrating horizontal position alignment of the dimple carrier DIPC and the dimple spacer DIPS. As previously explained, the front alignment hole 54 of the dimple carrier DIPC and the front alignment pin 66 installed on the dimple spacer DIPS are aligned and mounted with one another.

Accordingly, the front alignment pin 66 may be inserted into the front alignment hole 54. In addition, the front alignment hole 54 extends in the Y direction, allowing the relative position in the Y direction between the dimple carrier DIPC and the dimple spacer DIPS to be adjusted.

Figure 15:
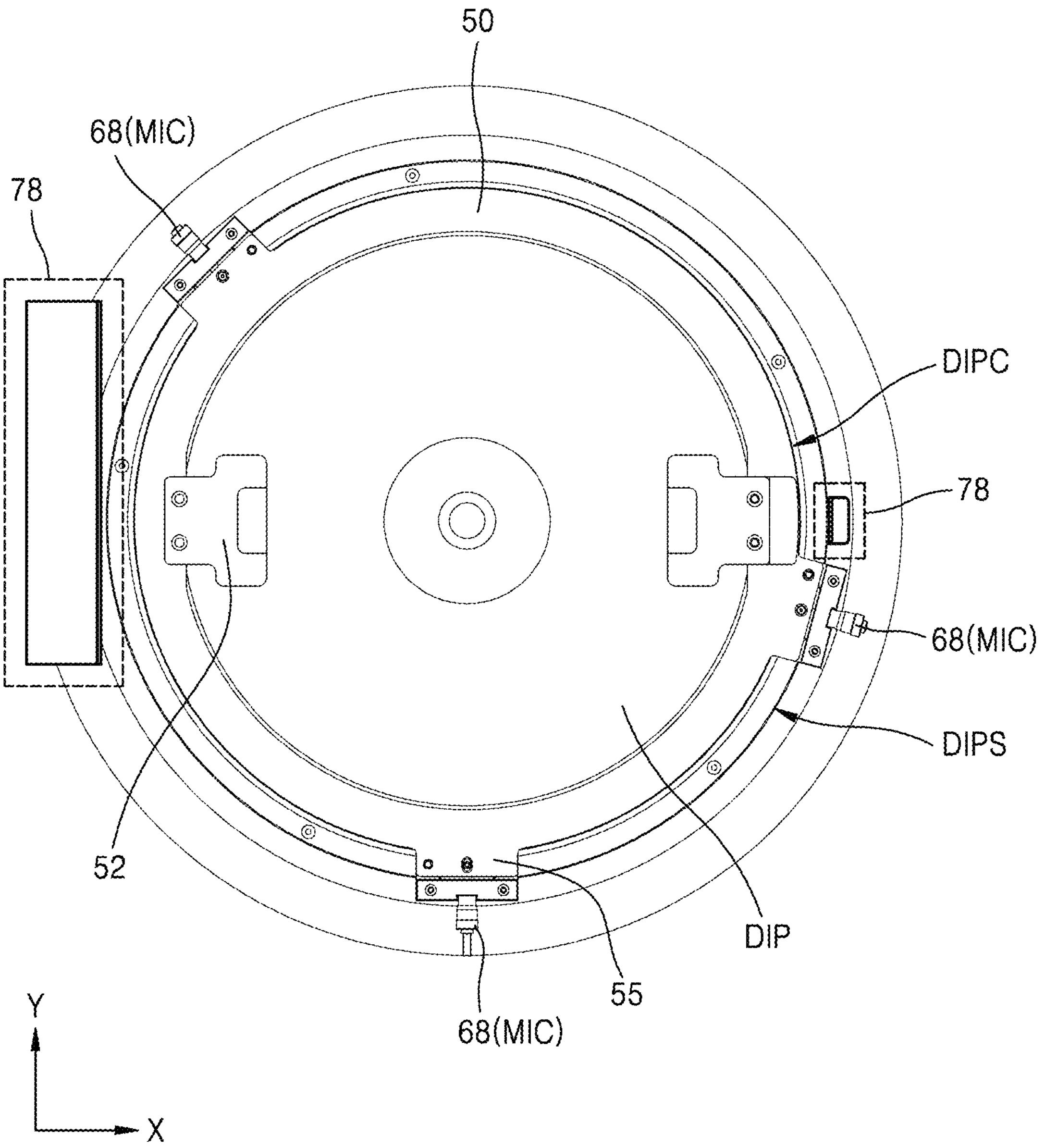

FIG. 15 is a plan view illustrating a dimple plate DIP, a dimple carrier DIPC, a dimple spacer DIPS, and a plurality of gap measurers MIC located on the body BD, which can have the characteristics described for the previously-described dimple plate DIP, dimple carrier DIPC, dimple spacer DIPS, and plurality of gap measurers MIC except where indicated otherwise. In FIG. 15, reference number 78 may indicate other components attached to the body BD. Due to the presence of the other components 78 attached to the body BD, the protruding members 55 of the dimple carrier DIPC and the gap measurers MIC may not be installed at about 90 degrees intervals or opposite each other in the X and Y directions.

In some implementations, the protruding members 55 of the dimple carrier DIPC and the gap measurers MIC may be installed at intervals of about 75 degrees or about 142.5 degrees in the circumferential direction. For example, as shown in FIG. 15, two protruding members 55 can have a spacing between one another of about 75 degrees, and a third protruding member 55 can be spaced apart from each of those protruding members 55 by about 142.5 degrees. The spacings can correspond to spacings of the front alignment hole 54 and the alignment guide holes 58.

Figure 16:
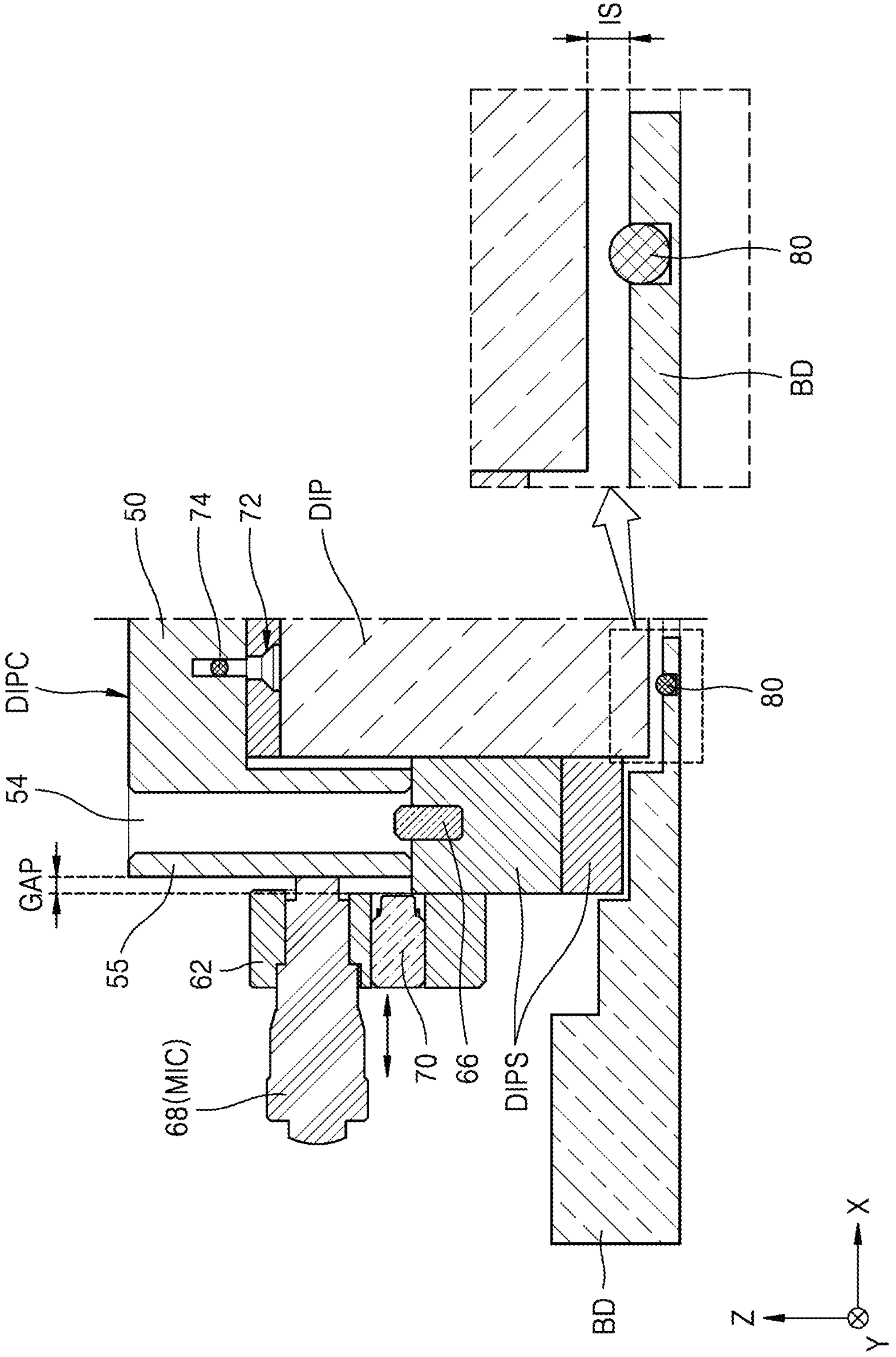

FIG. 16 is a cross-sectional view showing a dimple plate DIP, a dimple carrier DIPC, a dimple spacer DIPS, and a plurality of gap measurers MIC located on a body BD, which can have the characteristics described for the previously-described dimple plate DIP, dimple carrier DIPC, dimple spacer DIPS, plurality of gap measurers MIC, and body BD except where indicated otherwise.

As shown in FIG. 16, the dimple plate DIP and the dimple carrier DIPC may be coupled with alignment pins 74 in a dimple alignment hole 72. The dimple carrier DIPC includes a cylindrical carrier body 50. An O-ring 80 may be installed on the lower portion of the dimple plate DIP. The dimple plate DIP is spaced apart from the body BD at a predetermined distance (IS) and does not contact the body BD.

As described previously, when the dimple plate DIP is spaced vertically apart from the body BD, damage to the O-ring may be reduced or prevented by securing free space for the O-ring located under the dimple carrier DIPC and the dimple plate DIP, and damage to the dimple plate DIP may be reduced or prevented when adjusting the gap between the dimple spacer DIPS and the dimple plate DIP.

Further, as described previously, the front alignment hole 54 is installed in the protruding members 55, and the front alignment pin 66 is installed in the dimple spacer DIPS. The gap measurers MIC includes the measuring bodies 62 and control knobs 68. The gap GAP between the measuring bodies 62 and the protruding members 55 of the dimple carrier DIPC is adjusted using the gap adjustment pushers 70.

Figure 17:
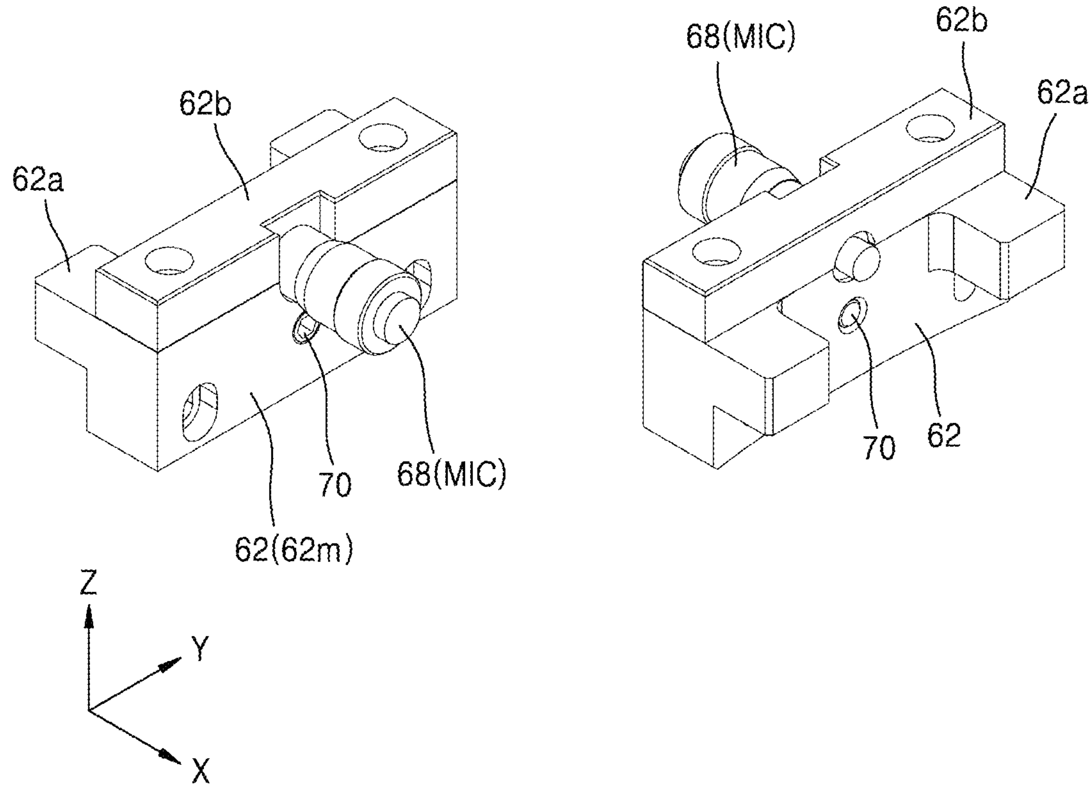

FIG. 17 is a perspective view showing gap measurers MIC located on the dimple spacer DIPS. As previously described, the gap measurers MIC may include measuring bodies 62 and control knobs 68. The measuring bodies 62 may include a main portion 62*m*, a shelf portion 62*a*, and a cap portion 62*b*. The shelf portion 62*a* protrudes from both sides of the main portion 62*m* and may be composed of two portions. The protruding members 55 of the dimple carrier DIPC may be inserted between the shelf portions 62*a*.

The control knobs 68 may be installed to extend through the main portion 62*m* and the cap portion 62*b*. The gap measurers MIC may measure the gap between the main part 62*m* and the dimple carrier DIPC, and the gap between the cap portion 62*b* and the dimple carrier DIPC. The gap measurers MIC may measure the gap between a dimple spacer DIPS and a dimple plate DIP. As a result, gap measurers MIC may be used to adjust the centering of the dimple plate DIP within the dimple spacer DIPS.

Figure 18:
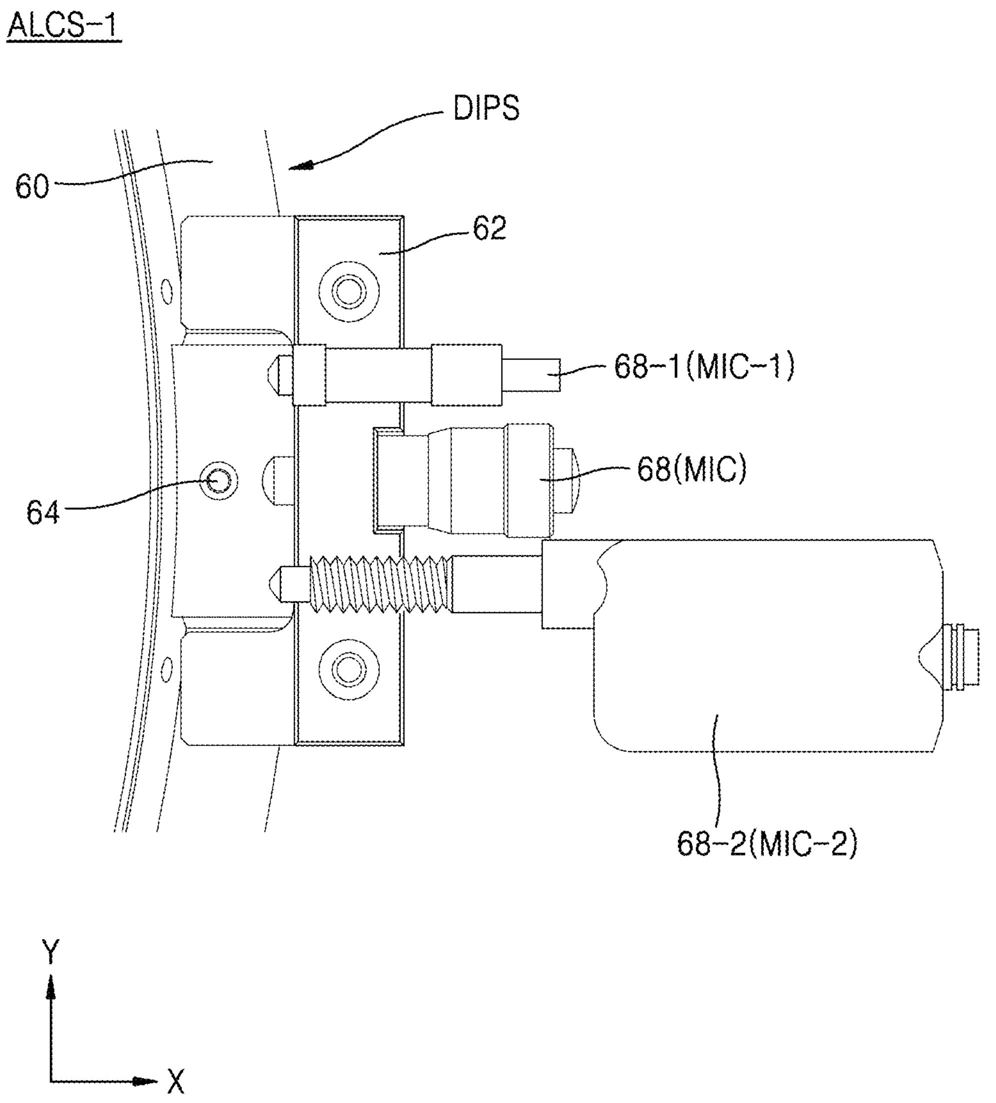
FIG. 18 is a plan view showing an example of a dimple plate precision adjustment device.

FIG. 18 is a plan view illustrating a dimple plate precision adjustment device according to some implementations.

The dimple plate precision adjustment device ALCS-1 of FIG. 18 may be the same as the dimple plate precision adjustment device ALCS shown in FIGS. 6 to 8 except that the dimple plate precision adjustment device ALCS-1 includes digital gap measurers MIC-1 and MIC-2. In FIG. 18, the descriptions given with reference to FIGS. 6 to 8 are omitted.

FIG. 18 shows a dimple spacer DIPS, gap measurers MIC, and the digital gap measures MIC-1 and MIC-2. The dimple plate precision adjustment device ALCS-1 may include the dimple spacer DIPS. The dimple spacer DIPS may include a cylindrical spacer body 60 and alignment guide pins 64.

The dimple plate precision adjustment device ALCS-1 may include the gap measurers MIC and the digital gap measurers MIC-1 and MIC-2. The gap measurers MIC and digital gap measurers MIC-1 and MIC-2 may be installed on the dimple spacer DIPS. The gap measurers MIC and the digital gap measurers MIC-1 and MIC-2 may include a measuring body 62 and control knobs 68, 68-1, and 68-2. The gap measurers MICs may be analog gap meters.

The gap measurers MIC and the digital gap measurers MIC-1 and MIC-2 may measure the gap between the dimple spacer DIPS and a dimple plate DIP and/or the gap between measuring bodies 62 and a dimple carrier DIPC.

When the dimple plate precision adjustment device ALCS-1 includes the digital gap measurers MIC-1 and MIC-2, the dimple plate precision adjustment device ALCS-1 may be used as process data for the plasma processing process by transmitting previously measured gap data to a controller of the plasma processing device.

While this disclosure contains many specific implementation details, these should not be construed as limitations on the scope of what may be claimed. Certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations, one or more features from a combination can in some cases be excised from the combination, and the combination may be directed to a subcombination or variation of a subcombination.

While various examples have been described, it will be understood that various changes in form and details may be made therein without departing from the spirit and scope of the present disclosure.

What is claimed is:

1. A dimple plate adjustment device comprising:

a dimple carrier arranged on a dimple plate and configured to mount the dimple plate;

a dimple spacer configured to mount the dimple carrier arranged on the dimple plate; and a plurality of gap measurers on the dimple spacer and spaced apart from one another, wherein the dimple carrier assembled on the dimple plate, the dimple spacer, and the gap measurers are configured to be installed in a body of a chamber in which an antenna electrode is installed, and wherein the gap measurers are configured to measure gaps between the gap measurers and the dimple carrier.

2. The dimple plate adjustment device of claim 1, wherein the dimple plate comprises a cylindrical dimple body and a plurality of dimple pockets in the cylindrical dimple body.

3. The dimple plate adjustment device of claim 1, wherein the dimple carrier comprises a cylindrical carrier body and a plurality of traction members on the cylindrical carrier body.

4. The dimple plate adjustment device of claim 3, wherein the dimple carrier includes a plurality of protruding members protruding beyond and below the cylindrical carrier body.

5. The dimple plate adjustment device of claim 4, wherein a first protruding member of the plurality of protruding members comprises a front alignment hole, and wherein a second protruding member of the plurality of protruding members comprises an alignment guide hole.

6. The dimple plate adjustment device of claim 5, comprising height adjustment pushers for adjusting a height of the dimple carrier, the height adjustment pushers arranged in the protruding members to a lateral side of the front alignment hole and the alignment guide hole.

7. The dimple plate adjustment device of claim 1, wherein the dimple spacer comprises a cylindrical spacer body and a front alignment pin on the cylindrical spacer body.

8. The dimple plate adjustment device of claim 1, wherein the dimple spacer comprise a cylindrical spacer body and a plurality of alignment guide pins on the cylindrical spacer body.

9. The dimple plate adjustment device of claim 1, wherein the plurality of gap measurers include measuring bodies on the dimple spacer, and control knobs installed in the measuring bodies.

10. The dimple plate adjustment device of claim 9, comprising gap adjustment pushers on the control knobs, the gap adjustment pushers configured to adjust a gap between the measuring bodies and the dimple carrier.

11. The dimple plate adjustment device of claim 1, wherein the gap measurers are either analog gap measurers or digital gap measurers.

12. A dimple plate adjustment device comprising:

a dimple carrier arranged on a dimple plate and configured to mount the dimple plate, wherein the dimple carrier includes a carrier body and a plurality of protruding members protruding beyond and below the carrier body, and wherein the protruding members comprise a front alignment hole and alignment guide holes;

a dimple spacer configured to mount the dimple carrier arranged on the dimple plate, wherein the dimple spacer includes a spacer body, front alignment pins on the spacer body, and alignment guide pins on the spacer body, wherein the front alignment pin and the alignment guide pins are arranged to be inserted into the front alignment hole and the alignment guide holes, respectively, when the dimple carrier is mounted on the dimple spacer; and a plurality of gap measurers on the dimple spacer and spaced apart from one another, wherein the gap measurers include measuring bodies on the dimple spacer, control knobs installed in the measuring bodies, and gap adjustment pushers configured to adjusting a gap between the measuring bodies and the dimple carrier, the gap adjustment pushers arranged below the control knobs, wherein the dimple carrier assembled on the dimple plate, the dimple spacer, and the gap measurer are configured to be installed in a body of a chamber in which an antenna electrode is installed, and wherein the gap measurers are configured to measure gaps between the gap measurers and the dimple carrier and to adjust a center of the dimple carrier with respect to the antenna electrode using the gap adjustment pushers.

13. The dimple plate adjustment device of claim 12, wherein the dimple plate includes a cylindrical dimple body and a plurality of dimple pockets in the cylindrical dimple body.

14. The dimple plate adjustment device of claim 12, wherein the dimple carrier comprises a plurality of traction members on the carrier body.

15. The dimple plate adjustment device of claim 12, comprising height adjustment pushers configured to adjust a height of the dimple carrier, the height adjustment pushers arranged in the protruding members to a lateral side of the front alignment hole and the alignment guide holes.

16. The dimple plate adjustment device of claim 12, wherein the gap measurers comprise analog gap measurers or digital gap measurers.

17. A dimple plate adjustment device comprising:

a dimple carrier arranged on a dimple plate and configured to mount the dimple plate, wherein the dimple carrier includes a carrier body, a plurality of traction members on the carrier body, and a plurality of protruding members protruding beyond and downward from the carrier body, wherein the protruding members are spaced apart from one another in a circumferential direction around the carrier body, wherein the protruding members comprise a front alignment hole and alignment guide holes, and wherein the dimple carrier includes height adjustment pushers configured to adjust a height of the dimple carrier, the height adjustment pushers arranged on the protruding members on a lateral side of the front alignment hole and the alignment guide hole;

a dimple spacer configured to mount the dimple carrier arranged on the dimple plate, wherein the dimple spacer includes a spacer body, and front alignment pins and alignment guide pins on the spacer body to correspond to the protruding members, wherein the front alignment pin and the alignment guide pins are arranged to be inserted into the front alignment hole and the alignment guide holes, respectively, when the dimple carrier is mounted on the dimple spacer; and a plurality of gap measurers on the dimple spacer and spaced apart from one another, wherein the gap measurers include measuring bodies on the dimple spacer and facing the protruding members, control knobs installed in the measuring bodies, and gap adjustment pushers configured to adjust gaps between the measuring bodies and the dimple carrier, the gap adjustment pushers arranged below the control knobs, wherein the dimple carrier assembled on the dimple plate, the dimple spacer, and the gap measurers are configured to be installed in a body of a chamber in which an antenna electrode is installed, and wherein the gap measurers are configured to measure the gaps between the gap measurers and the dimple carrier and to adjust a center of the dimple carrier with respect to the antenna electrode using the gap adjustment pushers.

18. The dimple plate adjustment device of claim 17, wherein the plurality of traction members are arranged symmetrically with respect to one another along the circumferential direction around the carrier body, and wherein the traction members extend radially inward.

19. The dimple plate adjustment device of claim 17, wherein the dimple plate includes a cylindrical dimple body and a plurality of dimple pockets in the cylindrical dimple body, wherein the antenna electrode includes a disc-shaped electrode body and a plurality of slits in the disc-shaped electrode body, and wherein the plurality of slits and the plurality of dimple pockets vertically overlap within the chamber.

20. The dimple plate adjustment device of claim 17, wherein the measuring bodies each include a main portion supported on one sidewall of the spacer body, a shelf portion extending from the main portion to an upper surface of the spacer body, and a cap portion on the shelf portion and facing the protruding members connected to the carrier body.

* * * * *